(12) United States Patent
Mano et al.

(10) Patent No.: US 9,307,645 B2
(45) Date of Patent: Apr. 5, 2016

(54) PRINTED WIRING BOARD AND METHOD FOR MANUFACTURING PRINTED WIRING BOARD

(71) Applicant: IBIDEN Co., Ltd., Ogaki-shi (JP)

(72) Inventors: Yasuhiko Mano, Ogaki (JP); Kazuhiro Yoshikawa, Ogaki (JP); Takashi Kariya, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 450 days.

(21) Appl. No.: 13/938,637

(22) Filed: Jul. 10, 2013

(65) Prior Publication Data

US 2014/0020940 A1      Jan. 23, 2014

(30) Foreign Application Priority Data

Jul. 18, 2012   (JP) .................... 2012-159571

(51) Int. Cl.
| | |
|---|---|
| H05K 1/16 | (2006.01) |
| H05K 3/30 | (2006.01) |
| H05K 1/18 | (2006.01) |
| H05K 1/02 | (2006.01) |
| H05K 3/00 | (2006.01) |
| H05K 3/46 | (2006.01) |

(52) U.S. Cl.
CPC ............. H05K 1/165 (2013.01); H05K 1/186 (2013.01); H05K 3/30 (2013.01); H05K 3/4697 (2013.01); *H05K 1/0233* (2013.01); *H05K 3/0032* (2013.01); *H05K 3/4676* (2013.01); *H05K 2201/0209* (2013.01); *Y10T 29/4913* (2015.01)

(58) Field of Classification Search
USPC .................. 174/258, 84, 371, 481; 361/782
See application file for complete search history.

(56) References Cited

U.S. PATENT DOCUMENTS

| | | | | |
|---|---|---|---|---|
| 6,255,714 B1 * | 7/2001 | Kossives et al. | .... | H01F 17/0006 257/528 |
| 2006/0145805 A1 * | 7/2006 | Kim et al. | .......... | H01F 17/0006 336/200 |

FOREIGN PATENT DOCUMENTS

| | | |
|---|---|---|
| JP | 2008-270532 A | 11/2008 |
| JP | 2008270532 A * | 11/2008 |

OTHER PUBLICATIONS

U.S. Appl. No. 13/953,150, filed Jul. 29, 2013, Morita, et al.

* cited by examiner

*Primary Examiner* — Timothy Thompson
*Assistant Examiner* — Krystal Robinson
(74) *Attorney, Agent, or Firm* — Oblon, McClelland, Maier & Neustadt, L.L.P.

(57) ABSTRACT

A printed wiring board includes a core substrate, a first buildup layer formed on a first surface of the core substrate and including an insulation layer and a conductive layer, a second buildup layer formed on a second surface of the core substrate on the opposite side with respect to the first buildup layer and including an insulation layer and a conductive layer, and an inductor device positioned in the second buildup layer and including a resin insulation layer and a coil layer formed on the resin insulation layer. The second buildup layer has a cavity in which the inductor device is accommodated.

20 Claims, 19 Drawing Sheets

FIG. 4
(A)
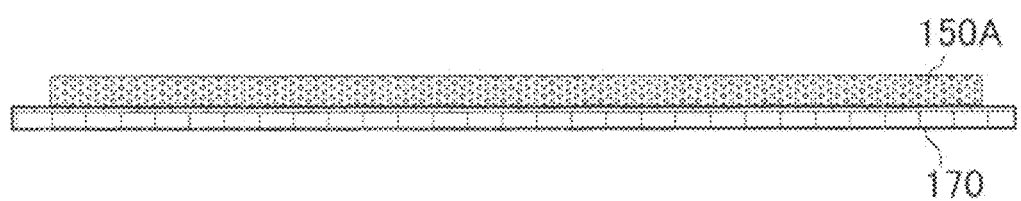
(B)
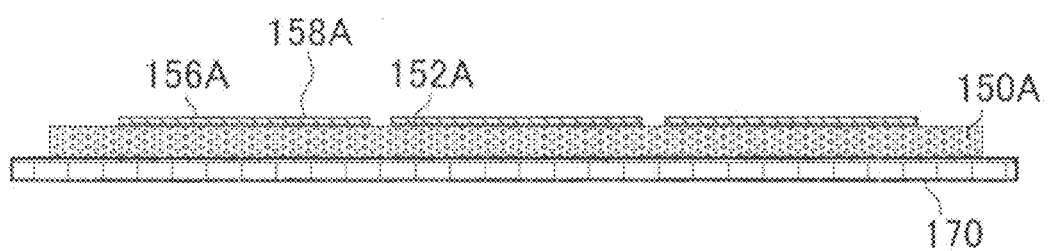
(C)
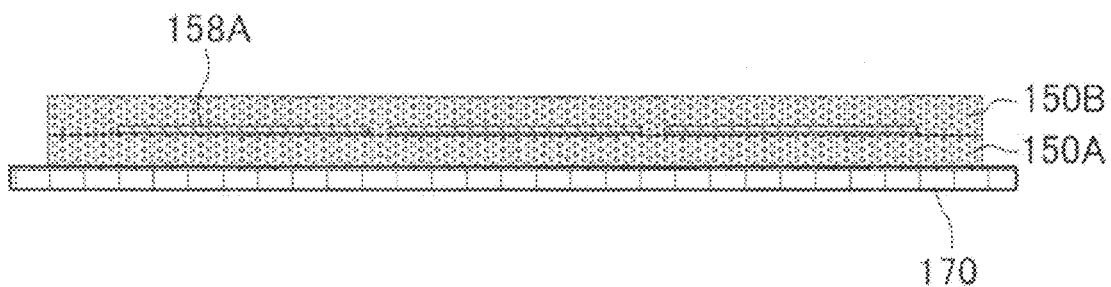

FIG. 5
(A)
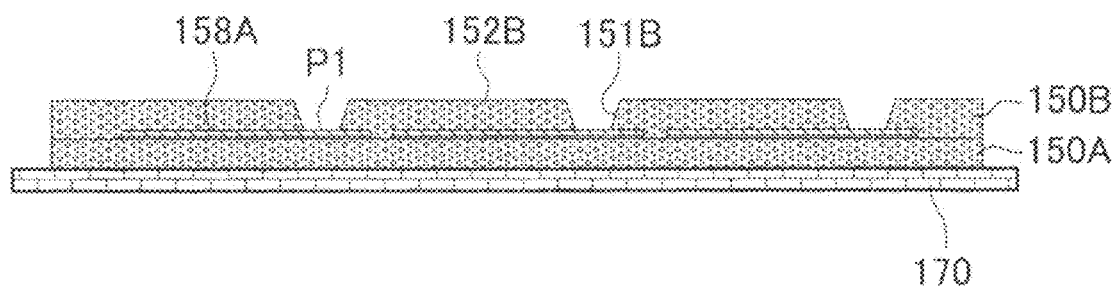
(B)
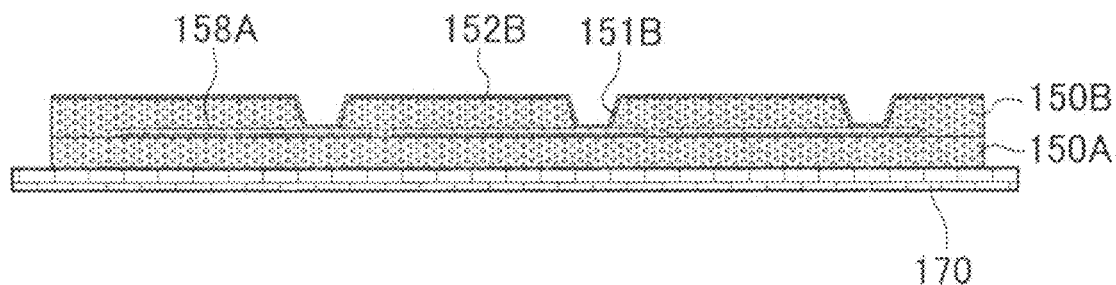
(C)
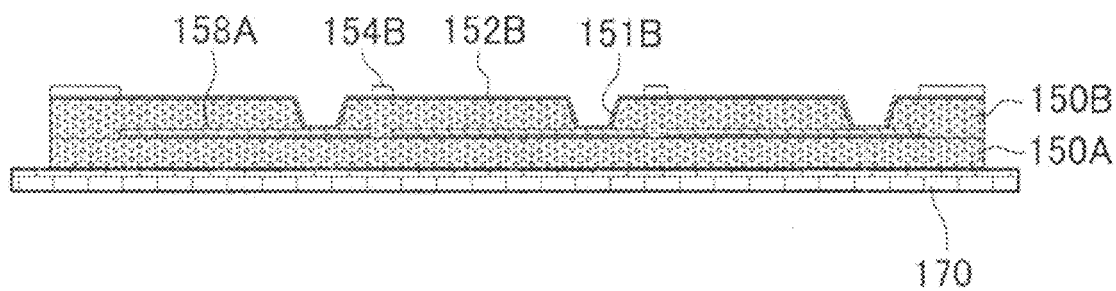

FIG. 6
(A)
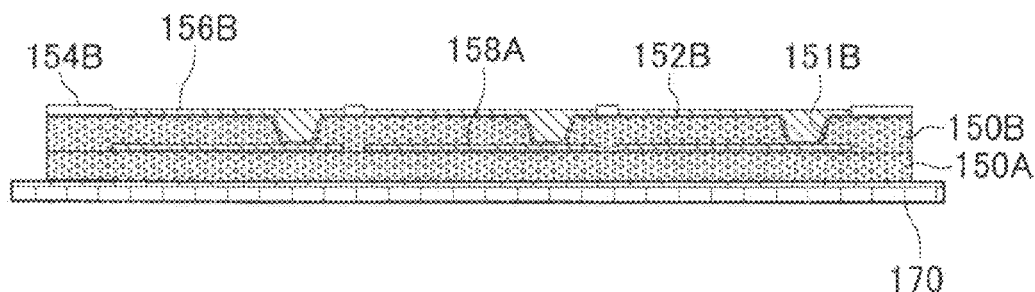
(B)
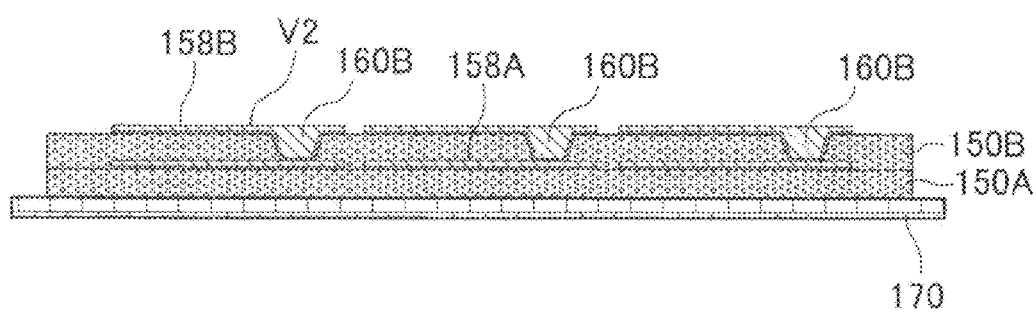
(C)
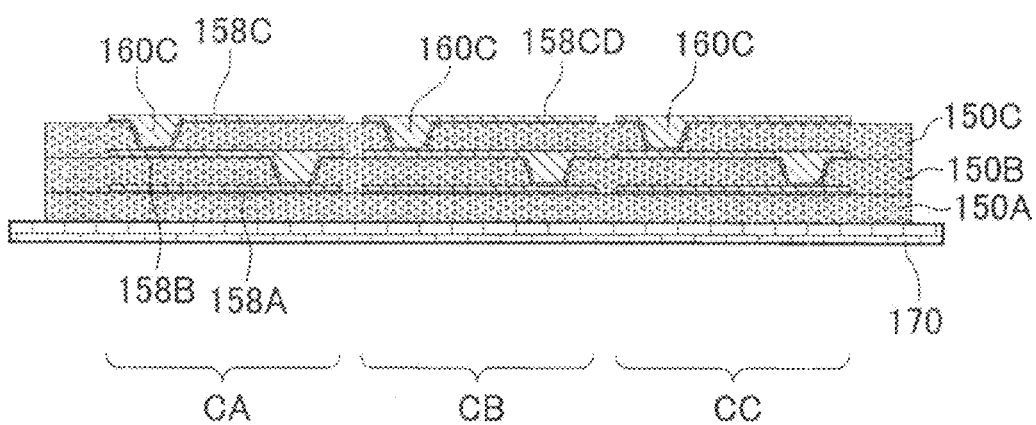

FIG. 10
(A)
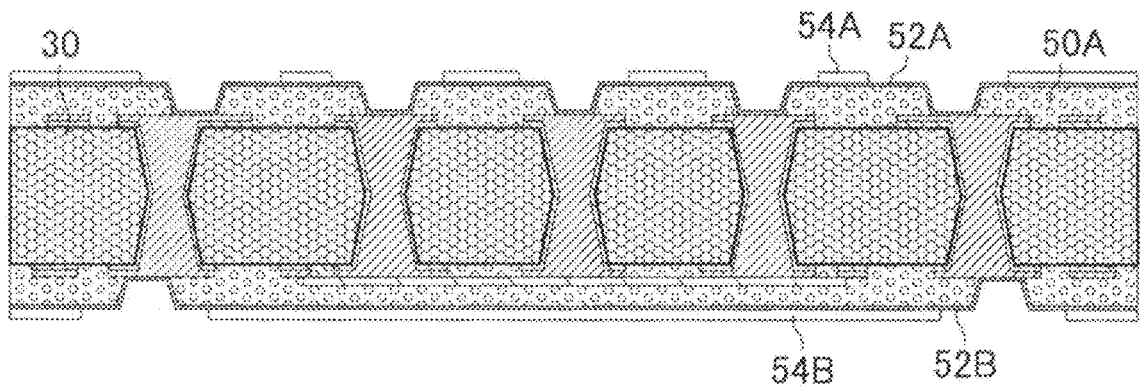
(B)
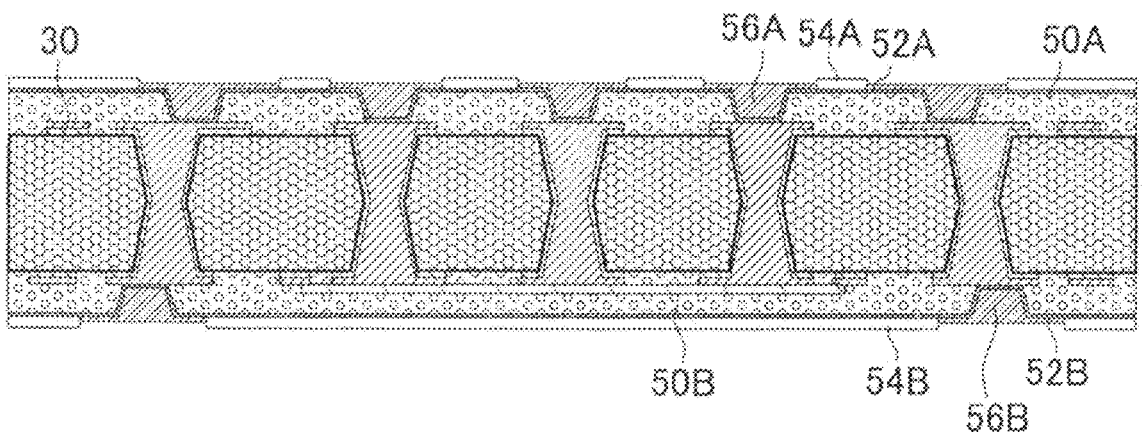
(C)
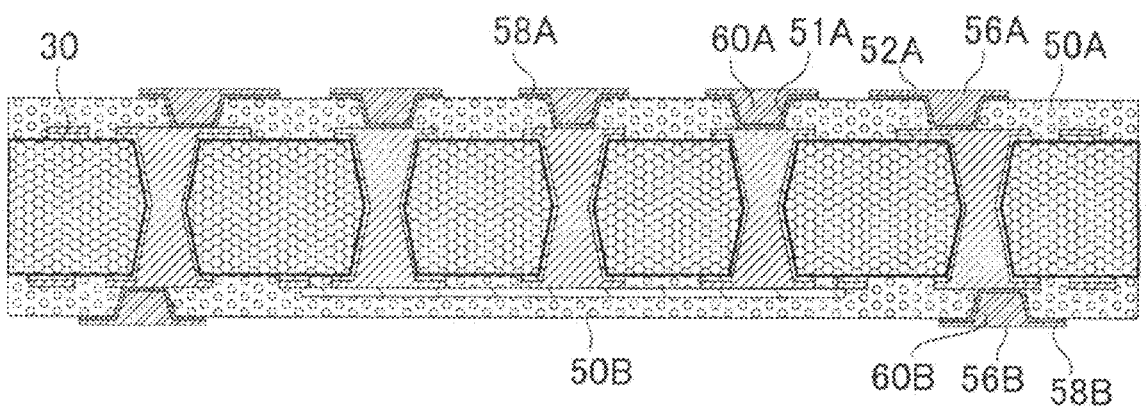

FIG. 13
(A)
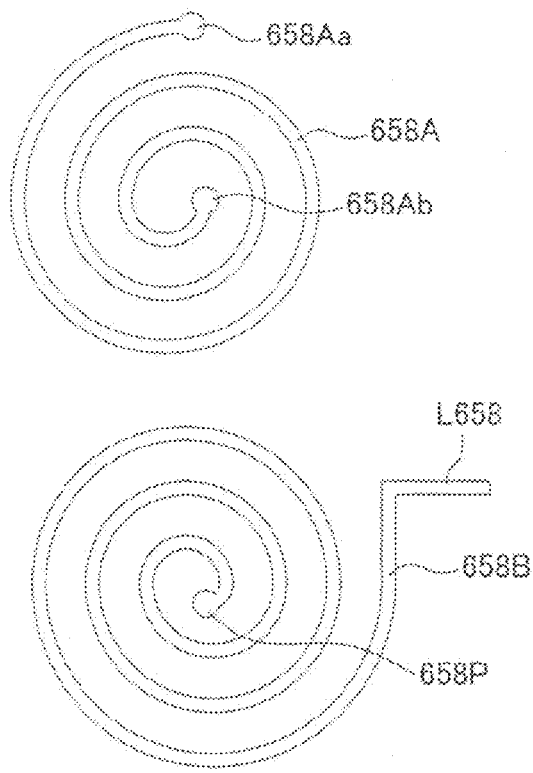
(B)
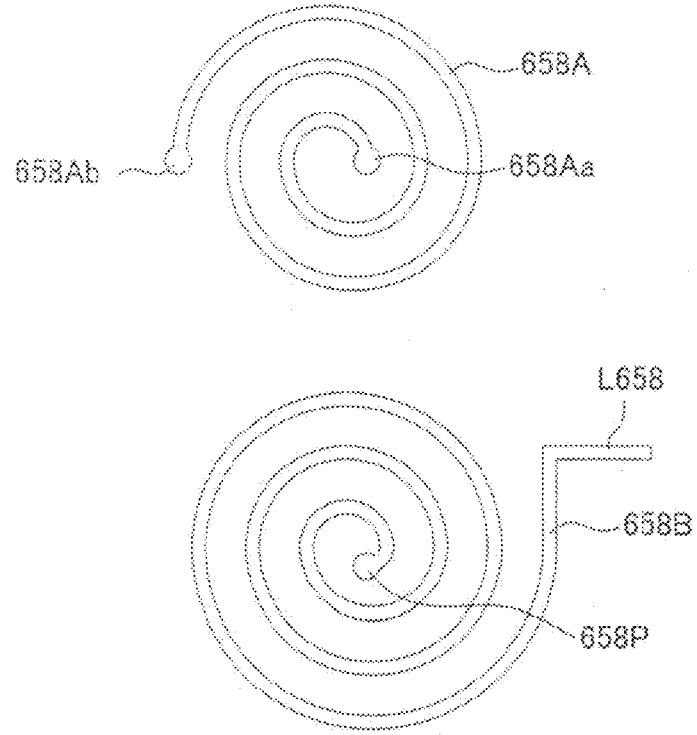

FIG. 16
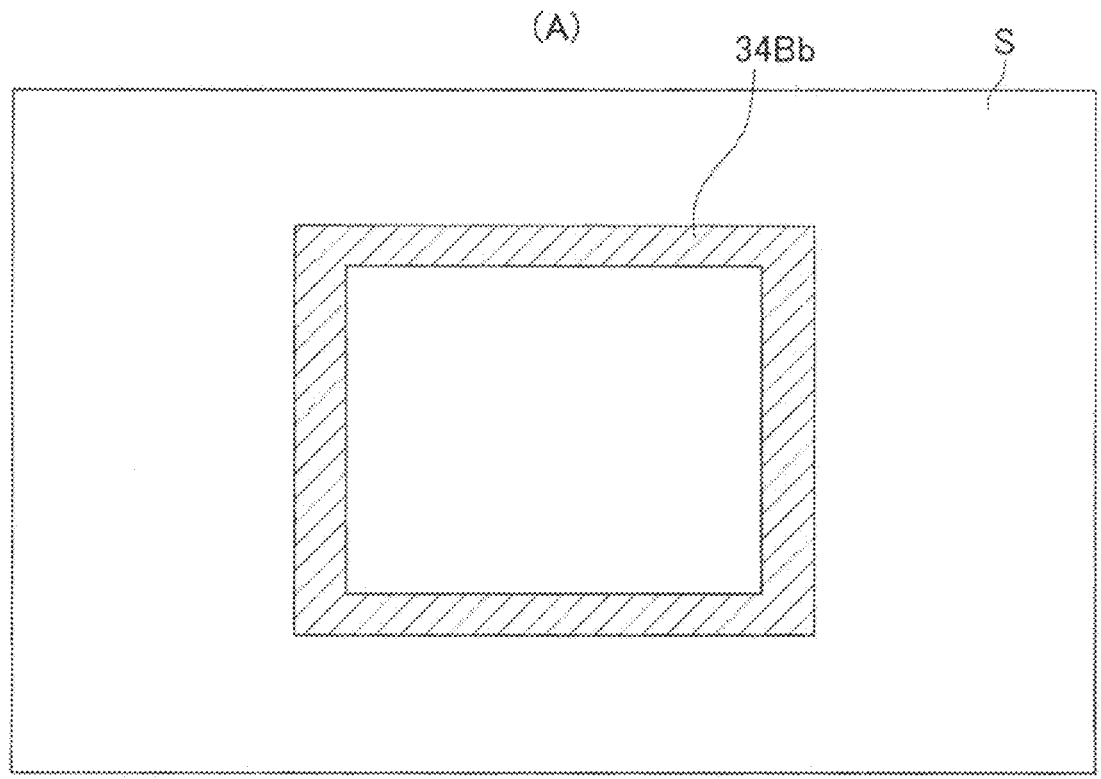
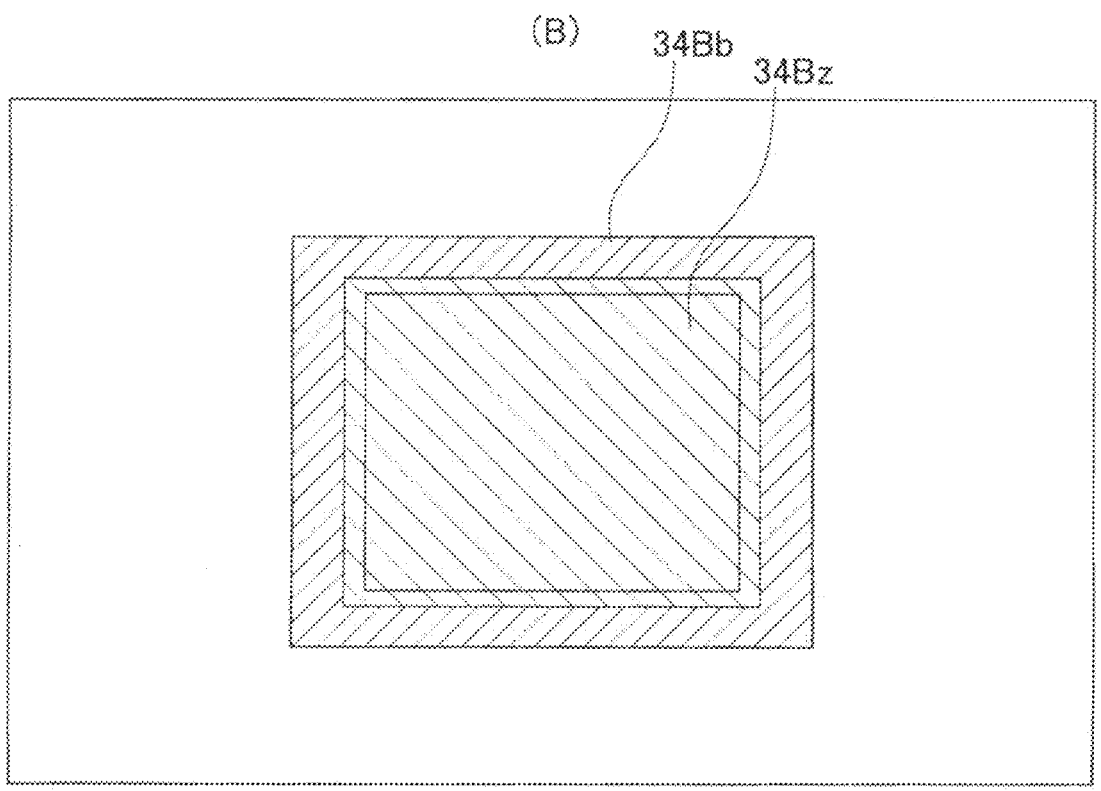

US 9,307,645 B2

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2012-159571, filed Jul. 18, 2012, the entire contents of which are incorporated herein by reference.

BACKGROUND OF THE INVENTION

1. Field of the Invention

The present invention relates to a printed wiring board with a built-in inductor component and to a method for manufacturing such a printed wiring board.

2. Description of Background Art

In Japanese Laid-Open Patent Publication No. 2008-270532, an inductor component is manufactured by pressing a thick metal sheet (100300 μM, for example). Such an inductor component is shown in FIG. 2 of Japanese Laid-Open Patent Publication No. 2008-270532. The inductor component is adhered to a substrate. Then, in Japanese Laid-Open Patent Publication No. 2008-270532, a buildup layer is formed on the substrate and the inductor component as shown in FIG. 10 of Japanese Laid-Open Patent Publication No. 2008-270532. The entire contents of this publication are incorporated herein by reference.

SUMMARY OF THE INVENTION

According to one aspect of the present invention, a printed wiring board includes a core substrate, a first buildup layer formed on a first surface of the core substrate and including an insulation layer and a conductive layer, a second buildup layer formed on a second surface of the core substrate on the opposite side with respect to the first buildup layer and including an insulation layer and a conductive layer, and an inductor device positioned in the second buildup layer and including a resin insulation layer and a coil layer formed on the resin insulation layer. The second buildup layer has a cavity in which the inductor device is accommodated.

According to another aspect of the present invention, a method for manufacturing a printed wiring board includes forming on a first surface of a core substrate a first buildup layer including an insulation layer and a conductive layer, forming on a second surface of the core substrate on the opposite side with respect to the first buildup layer a second buildup layer including an insulation layer and a conductive layer, forming in the second buildup layer a cavity for accommodating an inductor device including a resin insulation layer and a coil layer formed on the resin insulation layer, and accommodating the inductor device in the cavity of the second buildup layer such that the inductor device is positioned in the cavity of the second buildup layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4(A)-4(C) are views of steps showing a method for manufacturing an inductor component of the first embodiment;

FIGS. 5(A)-5(C) are views of steps showing the method for manufacturing an inductor component of the first embodiment;

FIGS. 6(A)-6(C) are views of steps showing the method for manufacturing an inductor component of the first embodiment;

FIGS. 10(A)-10(C) are views of steps showing the method for manufacturing a printed wiring board of the first embodiment;

FIGS. 13(A)-13(B) are plan views showing each coil layer of a laminated coil according to another example;

FIG. 16(A) is a plan view of a cavity-forming pattern; and FIG. 16(B) is a plan view of a release film;

DETAILED DESCRIPTION OF THE EMBODIMENTS

Figure 1:
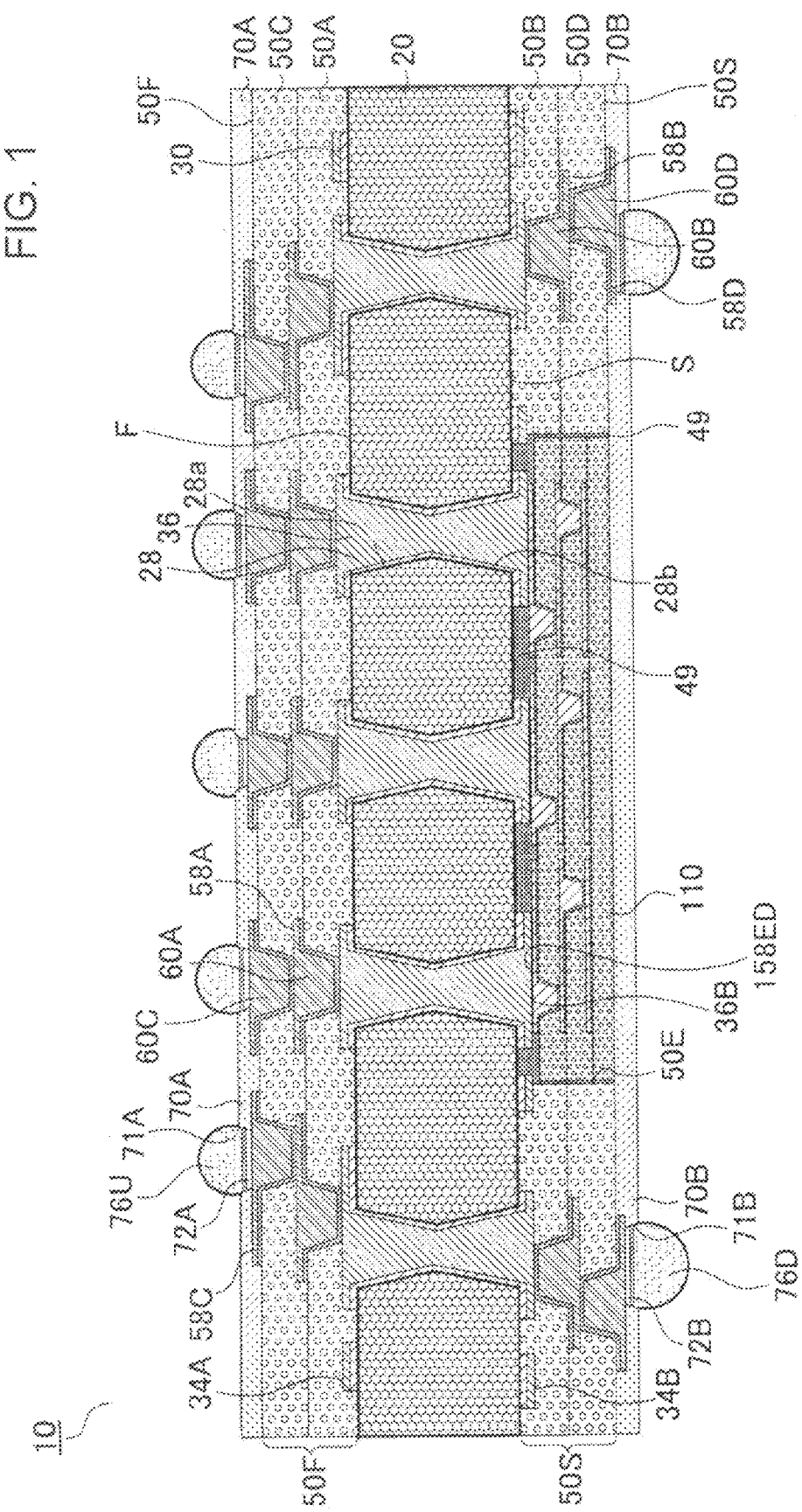
FIG. 1 is a cross-sectional view of a printed wiring board according to a first embodiment.

The embodiments will now be described with reference to the accompanying drawings, wherein like reference numerals designate corresponding or identical elements throughout the various drawings.

First Embodiment

FIG. 1 shows a cross section of printed wiring board 10 according to a first embodiment of the present invention. Printed wiring board 10 has core substrate 30 which is formed with the following: insulative base 20 having first surface (F) and second surface (S) opposite the first surface; first conductive layer (34A) on the first surface of the insulative base; second conductive layer (34B) on the second surface of the insulative base; and through-hole conductors 36 connecting first conductive layer (34A) and second conductive layer (34B).

Through-hole conductors 36 are formed by filling plating film in penetrating holes 28 formed in the insulative base. Penetrating hole 28 is made up of first opening portion (28a) formed on the first-surface side of the insulative base and of second opening portion (28b) formed on the second-surface side. First opening portion (28a) tapers from the second surface toward the first surface, and second opening portion (28b) tapers from the first surface toward the second surface. Then, first opening portion (28a) and second opening portion (28b) are joined in the insulative base. The first surface of the core substrate corresponds to the first surface of the insulative base, and the second surface of the core substrate corresponds to the second surface of the insulative base.

In addition, printed wiring board 10 has upper buildup layer (50F) on first surface (F) of core substrate 30. Upper buildup layer (50F) has insulation layer (upper interlayer resin insulation layer) (50A) formed on first surface (F) of core substrate 30, conductive layer (upper conductive layer) (58A) on insulation layer (50A), and via conductors (upper via conductors) (60A) which penetrate through insulation layer (50A) and connect conductive layer (58A) with first conductive layer (34A) or through-hole conductors 36. Upper buildup layer (50F) further includes insulation layer (uppermost interlayer resin insulation layer) (50C) formed on insulation layer (50A) and on conductive layer (58A), conductive layer (uppermost conductive layer) (58C) on insulation layer (50C), and via conductors (uppermost via conductors) (60C) which penetrate through insulation layer (50C) and connect conductive layer (58C) with conductive layer (58A) or via conductors (60A).

Moreover, printed wiring board 10 has lower buildup layer (50S) on second surface (S) of core substrate 30. Lower buildup layer (50S) has insulation layer (lower interlayer resin insulation layer) (50B) formed on second surface (S) of core substrate 30, conductive layer (lower conductive layer) (58B) on insulation layer (50B), and via conductors (lower via conductors) (60B) which penetrate through insulation layer (50B) and connect conductive layer (58B) with second conductive layer (34B) or through-hole conductors 36. Lower buildup layer (50S) further includes insulation layer (lowermost interlayer resin insulation layer) (50D) formed on insulation layer (50B) and on conductive layer (58D), conductive layer (lowermost conductive layer) (58B) on insulation layer (50D), and via conductors (lowermost via conductors) (60D) which penetrate through insulation layer (50D) and connect conductive layer (58D) with conductive layer (58B) or via conductors (60B).

Figure 11:
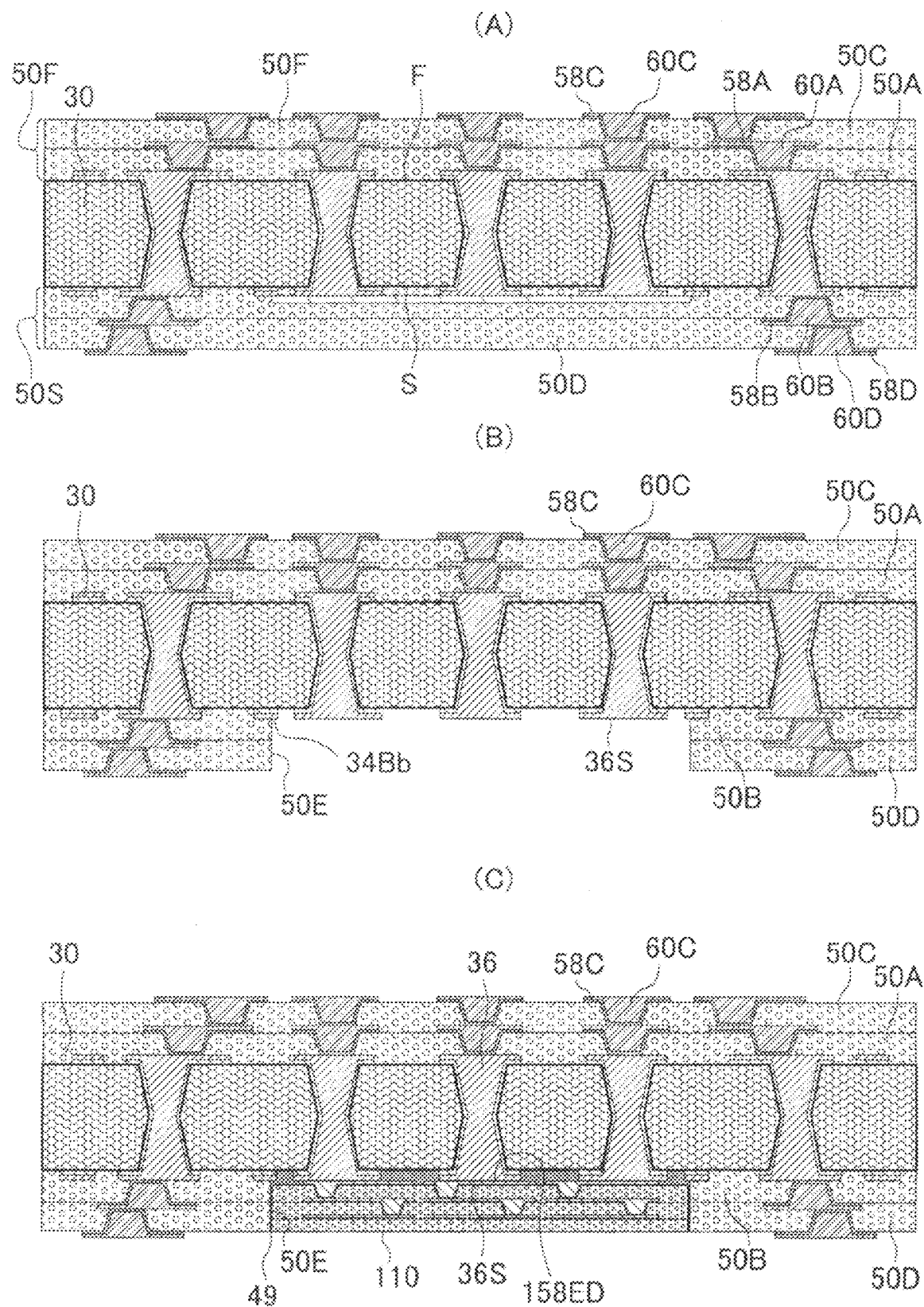
FIGS. 11(A)-11(C) are views of steps showing the method for manufacturing a printed wiring board of the first embodiment.
Figure 12:
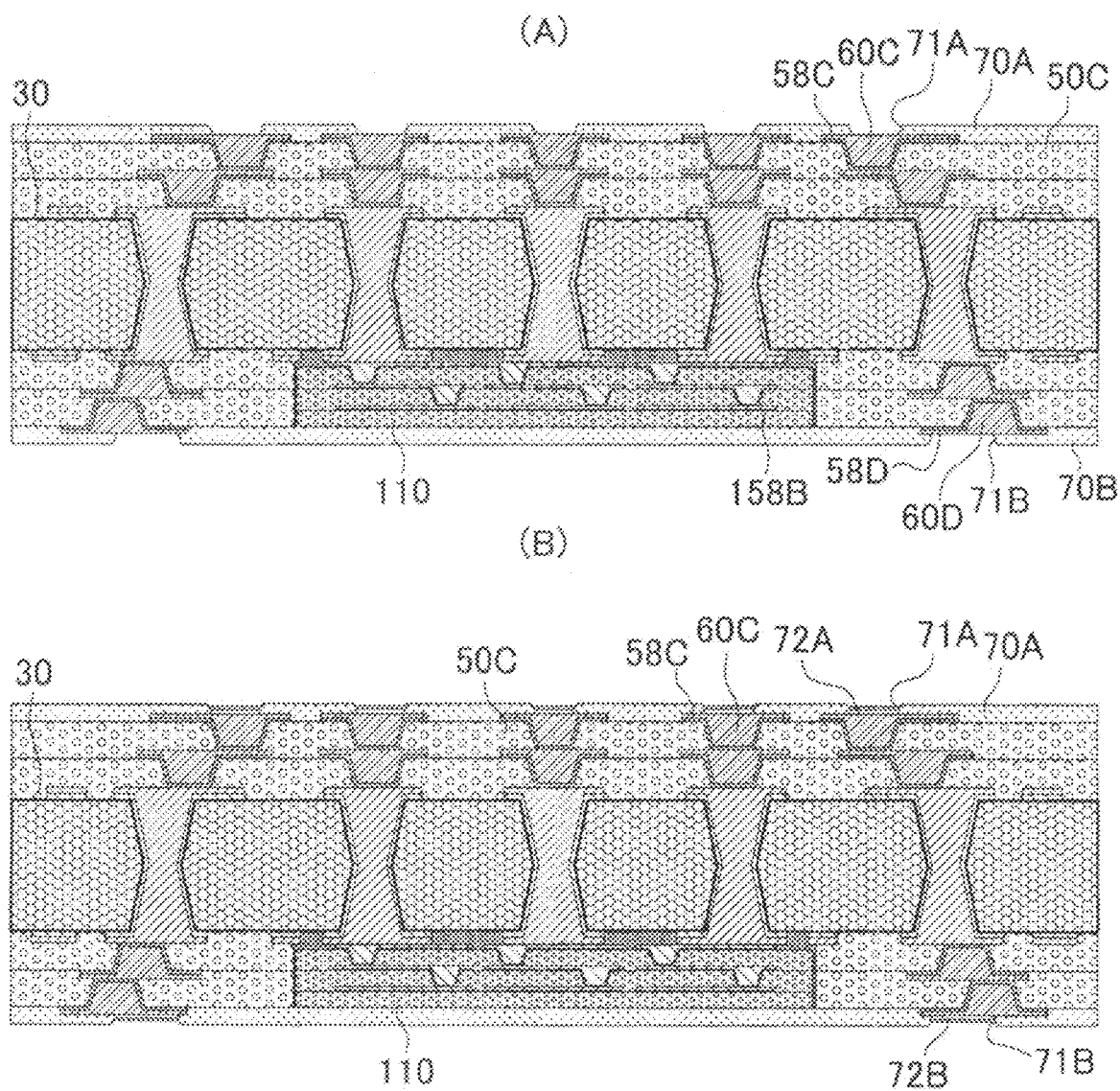
FIGS. 12(A)-12(B) are views of steps showing the method for manufacturing a printed wiring board of the first embodiment.

Furthermore, printed wiring board 10 of the first embodiment has cavity (50E) to accommodate inductor component 110 and has inductor component 110 accommodated in the cavity. Cavity (50E) is formed in the lower buildup layer. In the first embodiment, cavity (50E) penetrates through the lower buildup layer. The second surface of the core substrate and through-hole conductors are exposed through the cavity (FIG. 11(B)). Inductor component 110 is accommodated in cavity (50E). Cavity (50E) is formed in lower and lowermost interlayer resin insulation layers (50B, 50D), allowing electrode (158ED) of inductor component 110 to be electrically connected to lower surface (36S) of through-hole conductor 36 through a conductive member. The conductive member is made of solder, conductive paste or anisotropic conductive film, for example. Alternatively, mechanical connection may also be employed. In addition, it is an option to fill filler resin 49 in the gap between a side wall of the lower buildup layer exposed in cavity (50E) and the inductor component. It is also an option to fill filler resin 49 in the gap between the inductor component and the second surface of core substrate 30 or through-hole conductors. Filler resin 49 may include magnetic particles. The Q factor of the inductor component is less likely to be lowered. As for magnetic particles, ferric oxide, cobalt-iron oxide or the like may be used.

In addition, the printed wiring board of the first embodiment has solder-resist layer (70A) with openings (71A) formed on the upper buildup layer and solder-resist layer (70B) with openings (71B) formed on the lower buildup layer and on inductor component 110. Upper surfaces of conductive layers (58C, 58D) and via conductors (60C, 60D) exposed through the openings of the solder-resist layers work as pads. Metal films (72A, 72B) made of Ni film and Au film are formed on the pads, and solder bumps (76U, 76D) are formed on the metal films. An IC chip is mounted on the printed wiring board through solder bumps (76U) formed on the upper buildup layer. The printed wiring board is mounted on a motherboard through solder bumps (76D) formed on the lower buildup layer.

Figure 2:
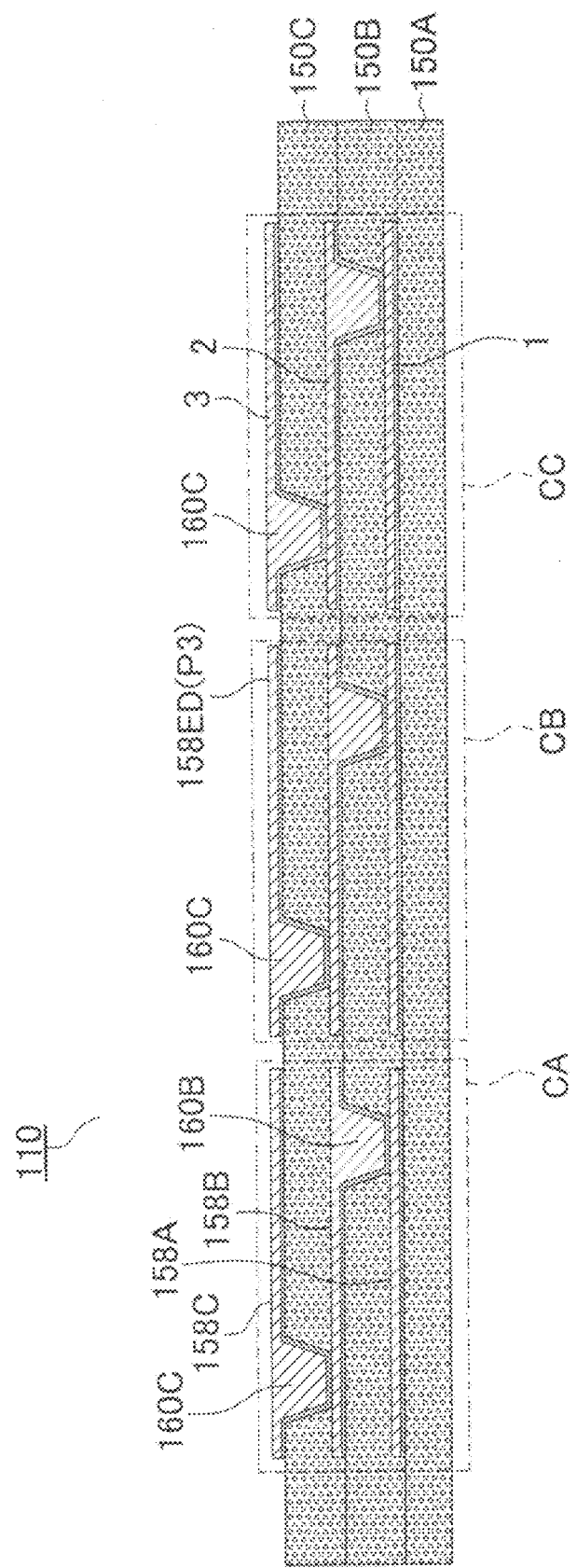
FIG. 2 is a cross-sectional view of an inductor component according to the first embodiment.

FIG. 2 is an enlarged view of inductor component 110 shown in FIG. 1. The inductor component accommodated in a printed wiring board of the first embodiment is made up of resin insulation layers (150A, 150B, 150C), coil layers (158A, 158B, 158C), and via conductors (160B, 160C). The resin insulation layers and coil layers are laminated alternately. Coil layers on different layers are connected by a via conductor formed in the resin insulation layer between the coil layers on different layers. The inductor component shown in FIG. 2 has the following: lowermost resin insulation layer (first resin insulation layer) (150A); lowermost coil layer (first coil layer) (158A) on lowermost resin insulation layer (150A); second resin insulation layer (150B) formed on first coil layer (158A) and on first resin insulation layer (150A); second coil layer (158B) on the second resin insulation layer; uppermost resin insulation layer (third resin insulation layer) (150C) formed on the second resin insulation layer and on the second coil layer; and uppermost coil layer (third coil layer) (158C) on the uppermost resin insulation layer. The first coil layer and the second coil layer are connected by first via conductor (160B) which penetrates through the second resin insulation layer, and the second coil layer and the third coil layer are connected by second via conductor (160C) which penetrates through the third resin insulation layer. The uppermost coil layer includes electrode (158ED) (P3), which is formed at an end of the uppermost coil layer. An electrode is formed at an end of the uppermost coil layer, and a via conductor is connected to the other end of the uppermost coil layer.

As shown in FIG. 2, multiple coil layers are laminated. Such a coil may be referred to as a laminated coil. The inductor component of the first embodiment has multiple laminated coils (CA, CB, CC), and those laminated coils are connected in parallel or in series with each other. The inductor component in FIG. 2 is formed with three laminated coils (shown in the drawing, CA: left, CB: center, CC: right). Those laminated coils are electrically connected to each other. It is an option for resin insulation layers interposed between the coil layers to contain magnetic particles made of iron-nickel alloy, iron alloy, amorphous alloy or the like. The inductance is enhanced. The lowermost resin insulation layer may also contain magnetic particles. Magnetic flux in the inductor component is less likely to leak to the outside. From such a viewpoint, magnetic film containing magnetic particles is preferred to be formed on the uppermost coil layer and on the uppermost resin insulation layer. The amount of magnetic particles is 30~60 vol. %. By mixing magnetic particles in a resin insulation layer of the inductor component and by reducing the thickness of the resin insulation layer, the number of insulation layers and the number of conductive layers of the lower buildup layer are reduced. Accordingly, the thickness of a printed wiring board is made thinner even when an inductor component is built into a buildup layer.

Regarding an inductor component, magnetic film is preferred to be formed underneath the lowermost resin insulation layer while being formed on the uppermost coil layer and uppermost resin insulation layer. Magnetic film may further be formed on a side wall of the inductor component. The magnetic flux in the inductor component is less likely to leak to the outside. Magnetic film is formed by sputtering or the like. Ferric oxide or the like may be used as the target.

Figure 3:
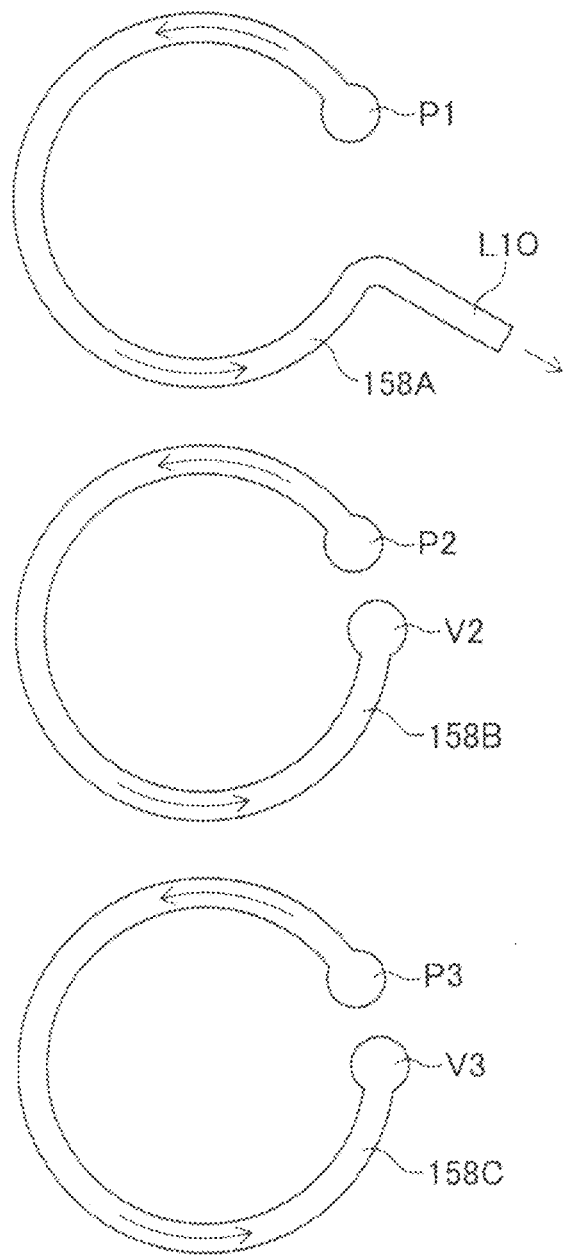
FIG. 3 is a plan view showing each coil layer of the inductor component of the first embodiment.
Figure 7:
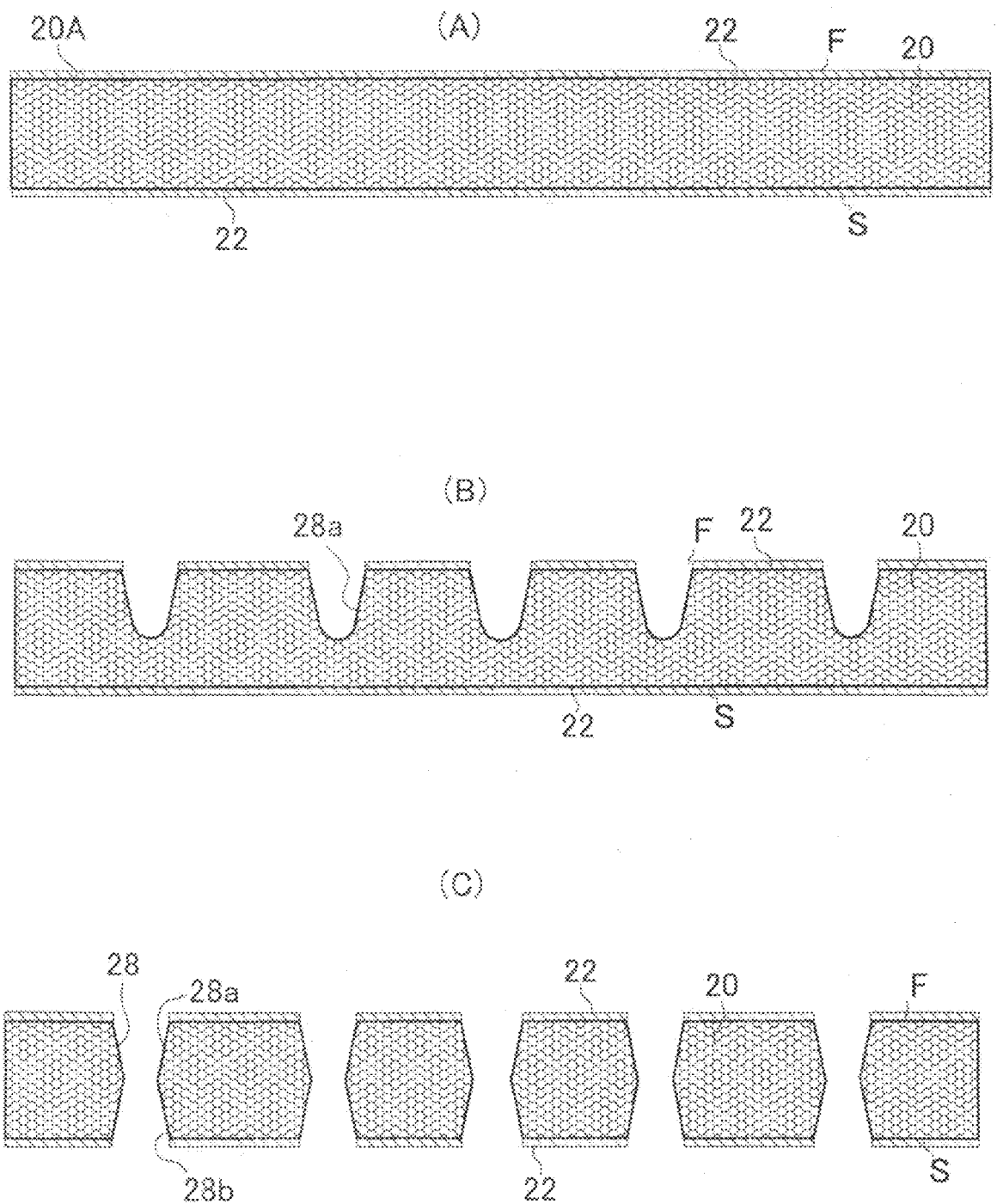
FIGS. 7(A)-7(C) are views of steps showing the method for manufacturing a printed wiring board of the first embodiment.
Figure 8:
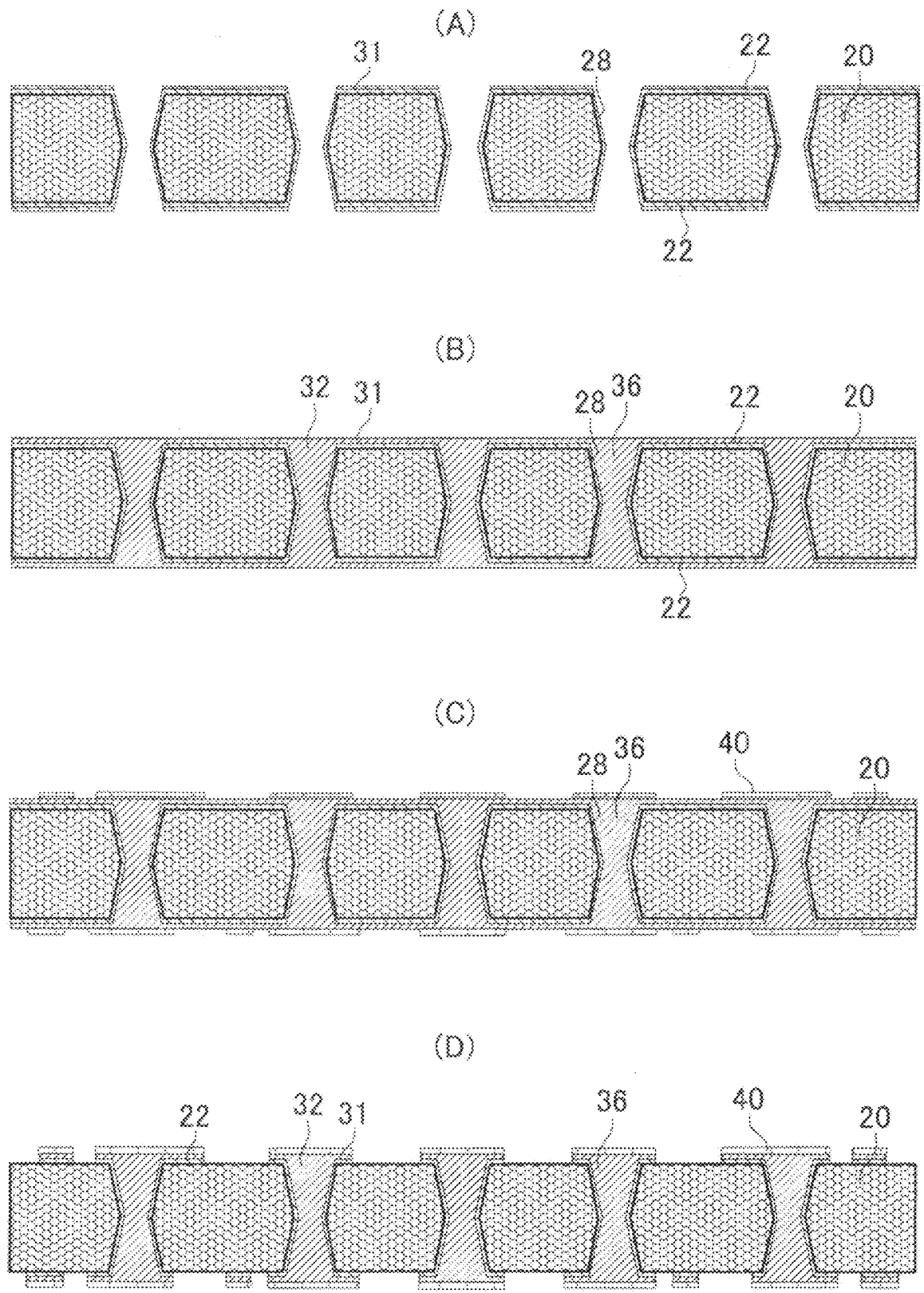
FIGS. 8(A)-8(D) are views of steps showing the method for manufacturing a printed wiring board of the first embodiment.
Figure 9:
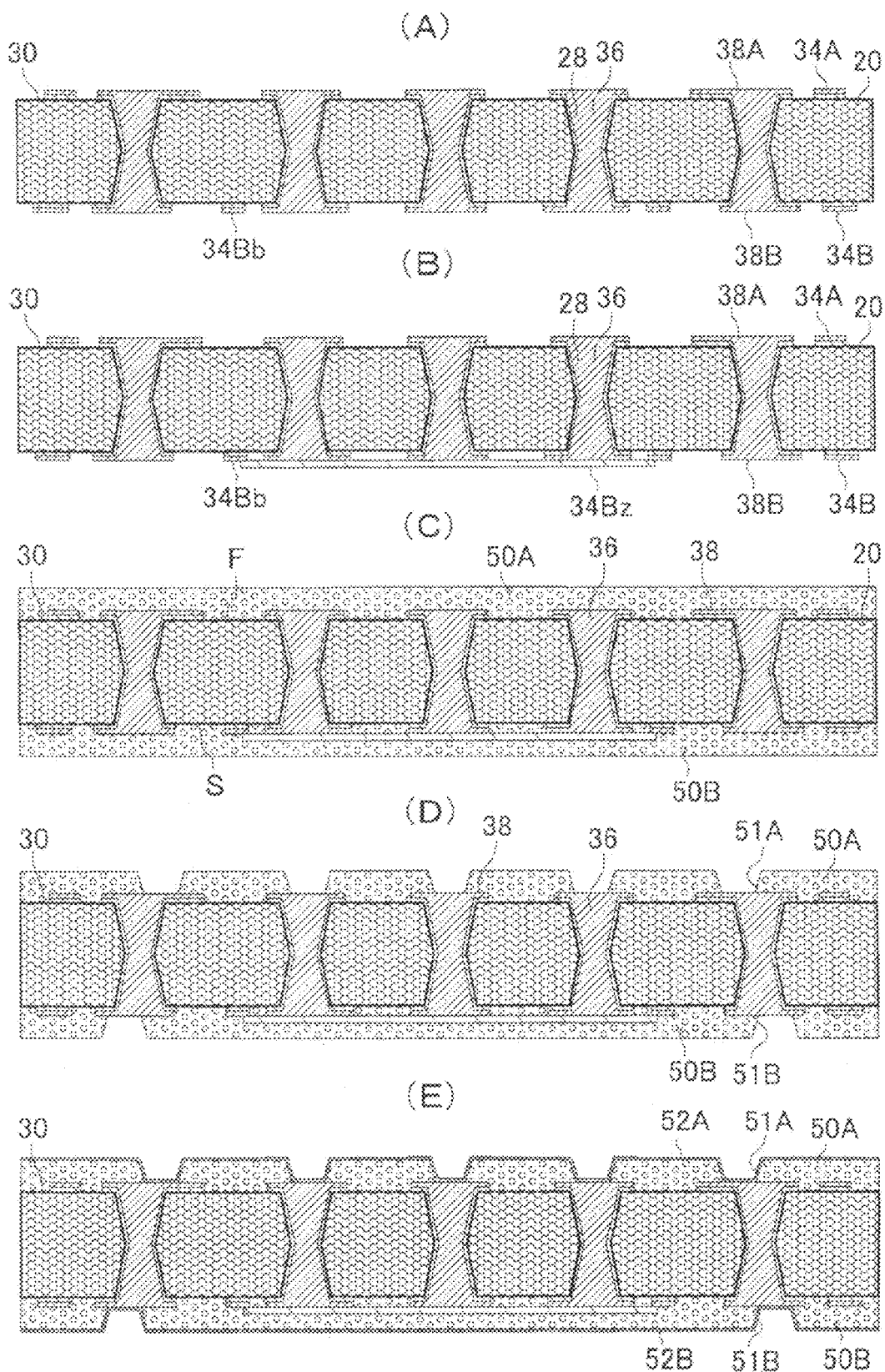
FIGS. 9(A)-9(E) are views of steps showing the method for manufacturing a printed wiring board of the first embodiment.

Coil layers (158A, 158B, 158C) are each made of a wiring pattern. An example of such a pattern shape is shown in FIG. 3. Each coil is formed on a plane. First through third coil layers (158A, 158B, 158C) are formed in ring-shaped conductive circuits. Each coil layer is substantially a circular conductive circuit. Accordingly, a three-turn coil is formed. The direction of electric current in each coil layer is the same. Arrows in the drawings show the direction of electric current. In this example, the direction is counterclockwise. In addition, coil layers are preferred to overlap with each other in a cross-sectional direction.

In the following, first laminated coil (CA) is described. Uppermost coil layer (third coil layer) (158C) has electrode (158ED) (P3) at an end. Electrode (P3) is shaped substantially circular. At the end opposite the electrode, the third coil layer has connection portion (V3) which is connected to via conductor (160C) formed in the third resin insulation layer. The third coil layer and second coil layer (158B) are connected by via conductor (160C). The second coil layer has via pad (P2) to be connected to via conductor (160C). Via pad (P2) is formed at an end of the second coil layer. At the end opposite via pad (P2), the second coil layer has connection portion (V2) which is connected to via conductor (160B) formed in the second resin insulation layer. The second coil layer and first coil layer (158A) are connected by via conductor (160B). The first coil layer has via pad (P1) to be connected to via conductor (160B). Via pad (P1) is formed at an end of the first coil layer. The end opposite via pad (P1) of the first coil layer is connected to connection wiring (L10). Then, connection wiring (L10) is connected to a second laminated coil. The second laminated coil is formed in the same manner as the first laminated coil, and the direction of electric current flowing through the first laminated coil and the second laminated coil is the same. The uppermost coil layer of the second laminated coil is connected to connection wiring, which is connected to a third laminated coil.

FIG. 13 shows another example of a laminated coil. Only the uppermost and lowermost coil layers are shown in the drawings. In the example, each coil layer is formed with a spiral conductive circuit (wiring pattern). The same as the laminated coil shown in FIG. 3, uppermost coil layer (658A) has electrode (658Aa) and connection portion (658Ab). In the coil shown in FIG. 13(A), via pad (658P) of lowermost coil layer (658B) is formed in the center of the lowermost coil layer, and the lowermost coil layer is connected to connection wiring (L658) at its periphery. When the number of coil layers is an even number, the electrode is formed at the outer periphery of the uppermost coil layer (FIG. 13(A)). When the number of coil layers is an odd number, electrode (658Aa) is formed in the center of coil layer (658A), and via pad (658P) of the lowermost coil layer is formed in the center of the lowermost coil layer (FIG. 13(B)).

Figure 14:
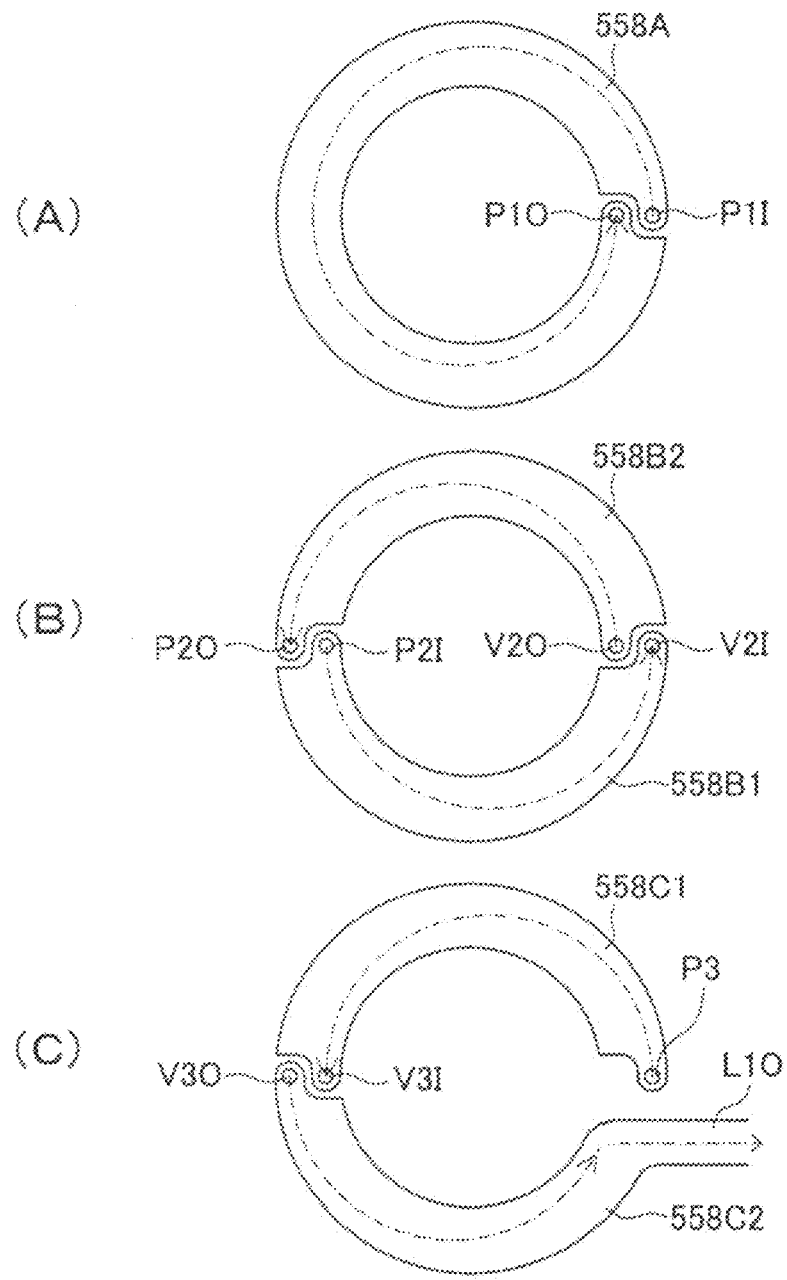
FIGS. 14(A)-14(C) are plan views showing each coil layer of a laminated coil according to yet another example.

FIG. 14 shows yet another example of a laminated coil. FIG. 14(C) shows third coil layers (uppermost coil layers) (558C1, 558C2). Third coil layer (558C1) has electrode (P3) at an end. Electric current flows counterclockwise in substantially a semicircle from electrode (P3) and reaches input connection portion (V3I) of third coil layer (558C1) (FIG. 14(C)). Third coil layer (558C1) is connected to input via pad (P2I) of second coil layer (558B1) through via conductor (160C). The electric current flows counterclockwise in a semicircle, and reaches input connection portion (V2I) of second coil layer (558B1) (FIG. 14(B)). Second coil layer (558B1) is connected to input via pad (P1I) of first coil layer (558A) through via conductor (160B) (FIG. 14(A)). The electric current flows counterclockwise in a semicircle of first coil layer (558A) and reaches output via pad (P1O) of first coil layer (558A). The first coil layer is connected to output connection portion (V2O) of second coil layer (558B2) through via conductor (160B). The electric current flows counterclockwise in a semicircle and reaches output via pad (P2O) of second coil layer (558B2) (FIG. 14(B)). The second coil layer is connected to output connection portion (V3O) of third coil layer (558C2) through via conductor (160C) (FIG. 14(C)). The electric current flows counterclockwise in a semicircle, and reaches connection wiring (L10) (FIG. 14(C)). The laminated coil shown in FIG. 14 is connected in parallel or in series with another laminated coil through the connection wiring. Except for the lowermost coil layer, the coil layers (third and second coil layers) are wiring patterns, which are made up of input circuits (558C1, 558B1) and output circuits (558C2, 558B2). Input circuits and output circuits are each formed with substantially a semicircular wiring pattern (FIG. 14).

The first coil layer (lowermost coil layer) is formed with a wiring pattern shaped in a substantially circular coil. Except for the lowermost coil layer, the coil layers are formed with two wiring patterns. In the first embodiment, a laminated coil is connected to an adjacent laminated coil having the same shape through connection wiring (L10). Inductor component 110 of the first embodiment is formed with three laminated coils.

When multiple laminated coils are connected in parallel, the multiple laminated coils are connected at low resistance. Thus, an inductor component with low resistance is obtained even when the inductor component is made up of multiple laminated coils.

An inductor component may be covered by resin film containing inorganic particles. Such resin film does not have magnetic properties. Other than particles, resin film and magnetic film contain resin such as epoxy. Bonding strength is enhanced between the inductor component and filler resin. Defects such as disconnected conductive layers caused by peeling between the inductor component and filler resin is prevented in a printed wiring board. In addition to magnetic particles, magnetic film may also contain inorganic particles that are not magnetic. Examples of inorganic particles without magnetic properties are silica particles, alumina particles and the like. The thermal expansion coefficient of magnetic film is reduced.

An inductor component is formed with resin insulation layers and coil layers laminated alternately, and has an electrode to be connected to a through-hole conductor of a printed wiring board. In addition, the inductor component is formed separately from the buildup layer. Accordingly, the thickness of an inductor component is adjusted by adjusting the number of resin insulation layers and the number of coil layers. An inductor component is manufactured by taking into consideration the thickness of the lower buildup layer. When the lower buildup layer is made up of two insulation layers (50B, 50D), the number of coil layers is increased by setting the thickness of resin insulation layers thinner than that of insulation layers. For example, the thickness of an insulation layer is 40 µm, and the thickness of a resin insulation layer is 15 µm. The inductance value is adjusted by the number of coil layers. The inductance value is set greater. Unlike the insulation layers of the buildup layer, resin insulation layers of the inductor component contain magnetic particles, contributing to achieving electrical characteristics that show desired inductance values, Q factors and the like. The inductor component of the first embodiment is suitable for a component to be built into the lower buildup layer. It is also an option for an inductor component to be covered by resin film that is not magnetic. The deterioration of such an inductor component is suppressed.

In the first embodiment, the buildup layer and the inductor component are manufactured using technology for printed wiring boards. Since the buildup layer and the inductor component are formed separately, the thickness of the wiring pattern of a coil layer can be set greater than the thickness of a conductive layer in the buildup layer. Thus, an inductor component with low resistance is built into a printed wiring board while manufacturing the printed wiring board having fine conductive circuits. The thickness of the wiring pattern of a coil layer is preferred to be 1.2-3 times the thickness of a conductive layer of the buildup layer. An inductor component with low resistance and high inductance is achieved. A thin printed wiring board with fine circuits is obtained. The thickness of resin insulation layers of an inductor component is less than the thickness of insulation layers of the buildup layer. An inductor component with high inductance is built into a thin printed wiring board.

In the first embodiment, an electrode of an inductor component is connected to a through-hole conductor by conductive material such as conductive paste. Wiring distance is reduced between an inductor component and a semiconductor element mounted on the printed wiring board, enhancing power-supply capacity for a semiconductor element.

In the first embodiment, filler resin 49, filled between the side walls of cavity (50E) and the inductor component and between the second surface of the core substrate and the inductor component, is preferred to contain magnetic particles. The impact on wiring patterns caused by magnetic flux from the inductor component is reduced.

In the first embodiment, since a solder-resist layer is formed directly on the inductor component, an insulation layer to adjust thickness is not required to be formed on the inductor component. The manufacturing process is simplified.

FIG. 4~FIG. 6 show steps for manufacturing an inductor component of the first embodiment.

Forming Resin Insulation-Layer Film Containing Magnetic Particles (A) Forming Resin-Containing Solution In a mixed solution containing 6.8 grams of MEK and 27.2 grams of xylene, 85 grams of epoxy resin (for example, brand name: Epikote 1007, made by Japan Epoxy Resin Co., Ltd.) and magnetic particles of ferric oxide or the like are added. Examples of magnetic particles are those of cobalt iron oxide, barium ferrite and the like.

(B) Forming Resin Insulation-Layer Film

Dicyandiamide (for example, brand name: CG-1200, made by B.T.I. Japan) as a curing agent and a curing catalyst (for example, brand name: Curezole 2E4HZ, made by Shikoku Chemicals Corporation) are added to the resin-containing solution prepared above (A). Then, the mixture is blended using a three-roller mill to make a solution for forming resin insulation layers. The amounts of the curing agent and curing catalyst are each 3.3 grams per 100 grams of epoxy. The solution for forming resin insulation layers is applied on a polyethylene terephthalate sheet using a roll coater (made by Cermatronics Boeki, Co., Ltd.) The solution is thermally dried at 160° C. for five minutes to remove the solvent. Resin insulation-layer film containing magnetic particles is obtained. The thickness is approximately 20 µm~50 µm. The amount of magnetic particles in the resin insulation-layer film is 30 vol. % to 60 vol. %. Here, it is an option for the resin insulation-layer film not to contain magnetic particles but to contain inorganic particles of silica, alumina or the like.

Film prepared in (B) above is laminated on support sheet 170, and the film is cured so that lowermost resin insulation layer (150A) is formed (FIG. 4(A)). Resin insulation layers in the first embodiment are made of resin such as epoxy and magnetic particles. In the drawings, the support sheet is shown as one sheet, but the support sheet is made up of a copper-clad laminate and copper foil, and the copper foil is ultrasonically bonded to the copper-clad laminate. Inductor components are formed on both surfaces of the support sheet, but forming inductor components on both surfaces is omitted in the drawings.

Electroless plated film (152A) is formed on resin insulation layer (150A). A plating resist with a predetermined pattern is formed on electroless plated film, and electrolytic plating is performed to form electrolytic plated film (156A) on electroless plated film (152A) exposed from the plating resist. Then, the plating resist is removed and electroless plated film between portions of electrolytic plated film (156A) is removed, forming first coil layer (158A) made up of electroless plated film (152A) and electrolytic plated film (156A) on the electroless plated film (FIG. 4(B)). The film prepared in (B) above is laminated on the first coil layer and on the lowermost resin insulation layer, and the film is cured so that second resin insulation layer (150B) is formed (FIG. 4(C)).

Using a laser, via-conductor opening (151B), which reaches via pad (P1) of the first coil layer, is formed in second resin insulation layer (150B) (FIG. 5(A)). Electroless plated film (152B) is formed on second resin insulation layer (150B) and in via-conductor opening (151B) (FIG. 5(B)).

Plating resist (154B) with a predetermined pattern is formed on electroless plated film (152B) (FIG. 5(C)). Electrolytic plating is performed to form electrolytic plated film (156B) on the electroless plated film exposed from the plating resist (FIG. 6(A)). The plating resist is removed and electroless plated film between portions of electrolytic plated film (156B) is also removed to form second coil layer (158B), via conductor (160B), connection portion (V2) and via pad (P2), which are made up of electroless plated film (152B) and electrolytic plated film (156B) on the electroless plated film (FIG. 6(B)). Via pad (P2) is not shown in the drawings. Via conductor (160B) connects the via pad of the first coil layer and the connection portion of the second coil layer. When an electrode is formed in the second coil layer, a laminated coil having two coil layers is completed. The surface of the second coil layer is roughened (not shown).

Figure 18:
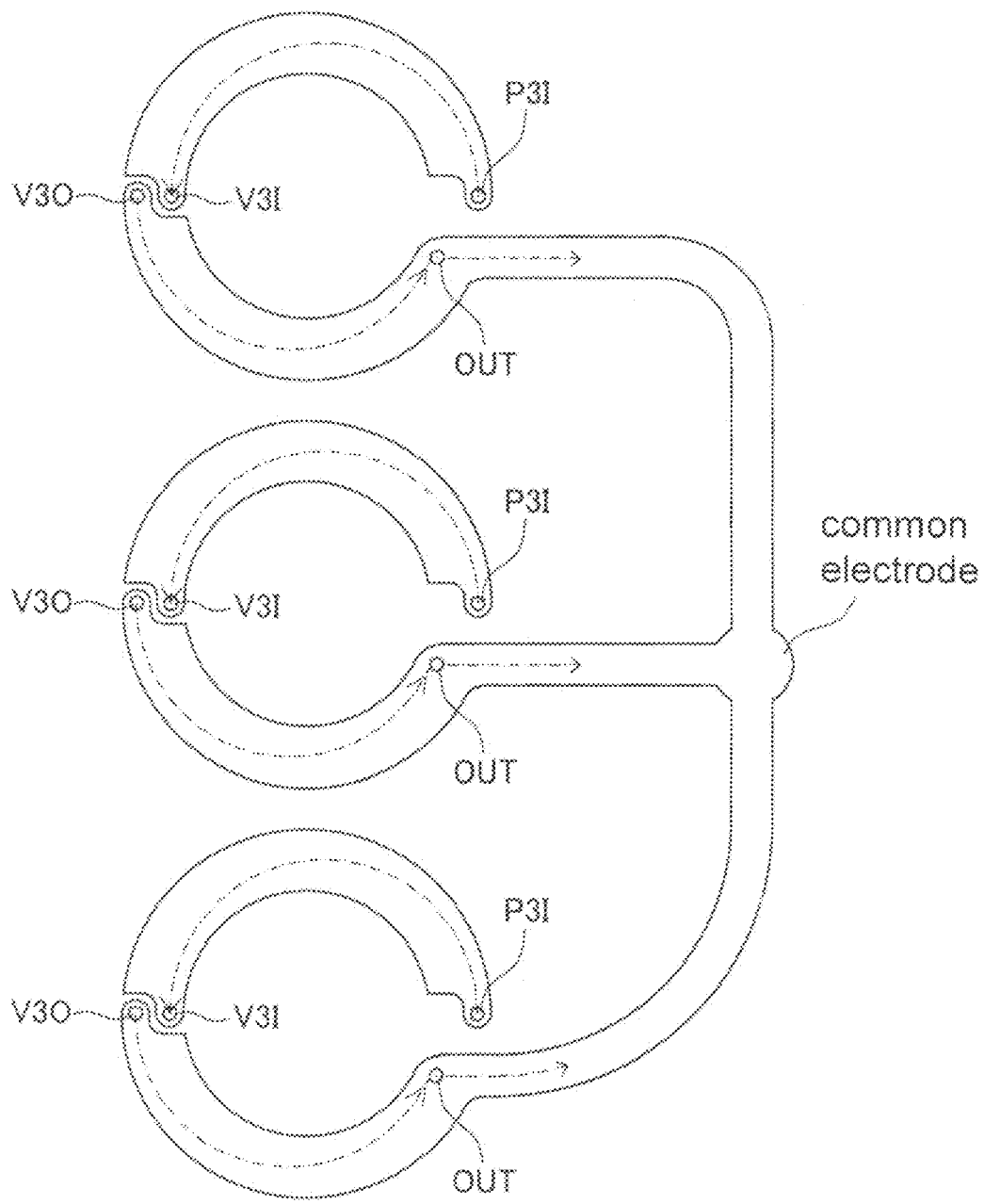
FIG. 18 is a plan view showing each coil layer of a laminated coil.

Using the same method for forming the second resin insulation layer and the method for forming the second coil layer, third resin insulation layer (150C) and third coil layer (uppermost coil layer) (158C) are subsequently formed on the second resin insulation layer and on the second coil layer. In FIG. 6(C), three laminated coils (first laminated coil (CA), second laminated coil (CB), third laminated coil (CC)) are shown on the support sheet. In the example shown, an inductor component is formed with first, second and third laminated coils (CA, CB, CC). The first and second laminated coils are connected by connection wiring not shown in the drawings. The second and third laminated coils are connected by connection wiring not shown in the drawings. The first, second and third laminated coils are connected in series. The direction of electric current flowing through each coil layer and each laminated coil is the same. Via conductor (160C) of the third resin insulation layer connects the second coil layer and the third coil layer. Surfaces of the first, second and third laminated coils are roughened. The surface of electrode (158ED) is not roughened. It is an option for multiple laminated coils (first, second and third laminated coils) to each have input electrode (P3I) and output electrode OUT, and to be connected in parallel with each other (FIG. 18). Alternatively, each laminated coil may be connected in parallel with a common electrode (FIG. 18). Then, the common electrode is connected to a printed wiring board by a through-hole conductor or the like.

Inductor components and support sheet 170 are separated to complete inductor components 110 (FIG. 2). The support sheet and inductor components are cut off inside the bonded portions. Inductor components are removed from the support sheet. Then, the copper foil is etched away, and an inductor component is completed.

A method for manufacturing printed wiring board 10 according to the first embodiment is shown in FIG. 7~FIG. 12.

(1) The starting material is double-sided copper-clad laminate (20A), which is formed with insulative base 20 and has copper foil 22 laminated on both of its surfaces. The thickness of the insulative base is 100~400 µm. If the thickness is less than 100 µm, the substrate strength is too low, and if the thickness exceeds 400 µm, the thickness of the printed wiring board becomes too great. The insulative base has first surface (F) and second surface (S) opposite the first surface. Surfaces of copper foils 22 are treated to be blackened (not shown) (FIG. 7(A)).

(2) From the first-surface (F) side of the insulative base, a laser is irradiated on double-sided copper-clad laminate (20A). First opening portions (28a) are formed, becoming narrower from the first surface toward the second surface of the insulative base (FIG. 7(B)).

(3) From the second-surface (S) side of the insulative base, a laser is irradiated on double-sided copper-clad laminate (20A). Second opening portions (28b) are formed, becoming narrower from the second surface toward the first surface of the insulative base (FIG. 7(C)). Second opening portion (28b) is joined with first opening portion (28a) in the insulative base to form penetrating hole 28 for a through-hole conductor.

(4) Electroless plating is performed to form electroless plated film 31 on the inner walls of penetrating holes and on the copper foils (FIG. 8(A)).

(5) Electrolytic plating is performed to form electrolytic plated film 32 on the electroless plated film. Through-hole conductors 36 are formed in penetrating holes. Through-hole conductors 36 are made up of electroless plated film 31 formed on the inner walls of penetrating holes and of electrolytic plated film 32 filled in the penetrating holes (FIG. 8(B)). In the first embodiment, through-hole conductors become narrower from the first surface toward the second surface while also becoming narrower from the second surface toward the first surface, thus facilitating the circulation of an electroplating solution. Accordingly, voids are less likely to occur in through-hole conductors.

(6) Etching resist 40 with a predetermined pattern is formed on electrolytic plated film 32 on surfaces of the insulative base (FIG. 8(C)).

(7) Electrolytic plated film 32, electroless plated film 31 and copper foil 22 exposed from the etching resist are removed (FIG. 8(D)). Then, the etching resist is removed to form conductive layers (34A, 34B), through-hole lands (38A, 38B), and conductive pattern (cavity-forming pattern) (34Bb) for forming the cavity to accommodate an inductor component (FIG. 9(A)). FIG. 16(A) shows a plan view of the cavity-forming pattern. The cavity-forming pattern is formed to match the outline of a cavity to accommodate an inductor component, and is shaped in substantially a frame.

Release film (34Bz) is placed on the second surface of the core substrate (FIG. 9(B)). The size of film (34Bz) is set smaller than the outline of the cavity-forming pattern. Film (34Bz) is placed inside the periphery of the cavity-forming pattern. The position for the release film and the size of the release film are shown in FIG. 16(B)).

(8) B-stage prepreg is laminated on core substrate 30. Instead of prepreg, resin film for resin insulation layers may be laminated. Prepreg contains reinforcing material such as glass cloth, but resin film for interlayer resin insulation layers does not contain reinforcing material. Both are preferred to contain inorganic particles such as glass particles. However, unlike resin insulation layers, they do not contain magnetic particles. The prepreg on the first and second surfaces of the core substrate is cured. Insulation layers (interlayer resin insulation layers) (50A, 50B) are respectively formed on the first and second surfaces of the core substrate (FIG. 9(C)). Insulation layer (50B) on the second surface of the core substrate is formed on the core substrate and on release film (34Bz).

(9) Via-conductor openings (51A, 51B) reaching conductive layers (34A, 34B) or through-hole conductors 36 are formed in insulation layers (50A, 50B) (FIG. 9(D)). Surfaces of insulation layers (50A, 50B) are roughened (not shown).

(10) Electroless plating is performed to form electroless plated films (52A, 52B) in the inner walls of via-conductor openings and on the insulation layers (FIG. 9(E)).

(11) Plating resists (54A, 54B) are formed on electroless plated films (52A, 52B) (FIG. 10(A)).

(12) Next, electrolytic plating is performed to form electrolytic plated films (56A, 56B) on electroless plated films (52A, 52B) exposed from the plating resists (FIG. 10(B)).

(13) Next, plating resists (54A, 54B) are removed using 5% NaOH. Then, electroless plated films (52A, 52B) exposed from electrolytic copper-plated films are etched away to form conductive layers (58A, 58B) made up of electroless plated films (52A, 52B) and electrolytic plated films (56A, 56B). Conductive layers (58A, 58B) include multiple conductive circuits and via-conductor lands (FIG. 10(C)).

(14) Treatments in FIG. 9(C)~FIG. 10(C) are repeated to form uppermost and lowermost interlayer resin insulation layers (50C, 50D) respectively on insulation layers (50A, 50B). Conductive layers (58C, 58D) are formed on uppermost and lowermost interlayer resin insulation layers (50C, 50D). Via conductors (60C, 60D) are formed in uppermost and lowermost interlayer resin insulation layers (50C, 50D), and conductive layers (58A, 58B) and conductive layers (58C, 58D) are respectively connected by via conductors (60C, 60D) (FIG. 11(A)). Upper buildup layer (50F) is formed on first surface (F) of core substrate 30, and lower buildup layer (50S) is formed on second surface (S) of the core substrate. Each buildup layer has insulation layers, conductive layers, and via conductors to connect conductive layers on different layers.

(15) To form a cavity to accommodate an inductor component, a laser is irradiated on cavity-forming pattern (34Bb) along the periphery of the release film. The laser is irradiated along the portions to be cut out. At that time, the periphery of the release film is positioned inside cavity-forming pattern (34Bb). Therefore, since cavity-forming pattern (34Bb) works as a laser irradiation stopper, the core substrate is less likely to suffer damage. Since insulation layers (50B, 50D) positioned inside the cutting portions are formed on release film (34Bz), such portions (portions to be taken out) are removed from the core substrate together with the release film. The release film is removed from the core substrate. Cavity (50E) is formed (FIG. 11(B)). Conductive paste is applied on through-hole conductors exposed in the cavity. Solder may be formed on the through-hole conductors.

(16) Through-hole conductors and electrodes of an inductor component are aligned, and inductor component 110 is accommodated in cavity (50E). The inductor component and through-hole conductors are electrically connected by conductive members. Through-hole conductors and electrodes of the inductor component are electrically connected. Resin (filler resin) 49 is filled in the gap between the cavity and the inductor component (FIG. 11(C)). The filler resin is filled between the inductor component and the side walls of the lower buildup layer created when the cavity is formed. The filler resin is also filled between the core substrate and the inductor component.

(17) Upper solder-resist layer (70A) with openings (71A) is formed on the upper buildup layer. Lower solder-resist layer (70B) with openings (71B) is formed on the lower buildup layer and inductor component 110 (FIG. 12(A)). Openings (71A, 71B) expose upper surfaces of conductive layers and via conductors. Those exposed portions work as pads.

(18) Metal films (72A, 72B) made of a nickel layer and a gold layer on the nickel layer are formed on the pads (FIG. 12(B)). Instead of nickel-gold layers, metal films made of nickel-palladium-gold layers may also be used. Since the lower buildup layer has a cavity, the printed wiring board tends to warp. Therefore, the thickness of the insulation layers of the lower buildup layer is preferred to be greater than the thickness of the insulation layers in the upper buildup layer. Alternatively, the insulation layers of the upper buildup layer are preferred not to contain reinforcing material, whereas the lower buildup layer contains reinforcing material. Warping is reduced in the printed wiring board.

(19) Next, solder bumps (76U) are formed on the pads of the upper buildup layer, and solder bumps (76D) are formed on the pads of the lower buildup layer. Printed wiring board 10 having solder bumps is completed (FIG. 1).

An IC chip is mounted on printed wiring board 10 through solder bumps (76U) (not shown). Then, the printed wiring board is mounted on a motherboard through solder bumps (76D).

Second Embodiment

Figure 15:
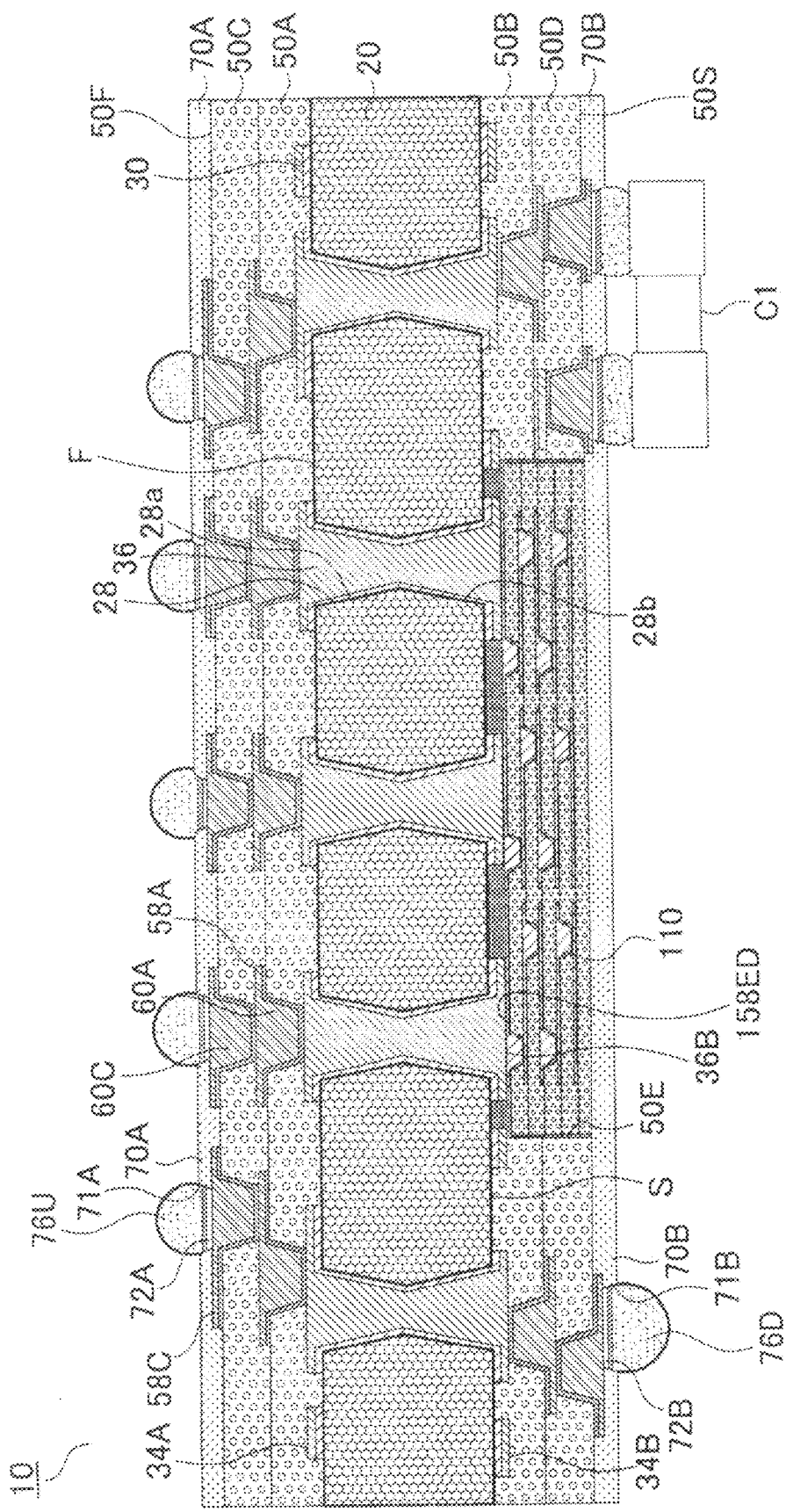
FIG. 15 is a cross-sectional view of a printed wiring board according to a second embodiment.

FIG. 15 shows a printed wiring board according to a second embodiment.

In the second embodiment, an inductor component is accommodated in lower buildup layer (50D) the same as in the first embodiment. In the second embodiment, chip capacitor (C1) is mounted on the lower buildup layer. The inductor component and chip capacitor (C1) are connected with short wiring in the second embodiment. Accordingly, when a filter for a DC-DC converter is formed using such a structure, the performance is expected to be high.

The resin insulation layers of the inductor component according to the second embodiment do not contain magnetic particles. The resin insulation layers of the inductor component according to the second embodiment are made of inorganic particles of silica or the like and resin such as epoxy.

Forming Resin Insulation-Layer Film Containing Inorganic Particles (A) Forming Resin-Containing Solution In a mixed solution containing 6.8 grams of MEK and 27.2 grams of xylene, 85 grams of epoxy resin (for example, brand name: Epikote 1007, made by Japan Epoxy Resin Co., Ltd.) and inorganic particles of silica or the like are added. Inorganic particles do not include magnetic particles.

(B) Forming Resin Insulation-Layer Film

Dicyandiamide (for example, brand name: CG-1200, made by B.T.I. Japan) as a curing agent and a curing catalyst (for example, brand name: Curezole 2E4HZ, made by Shikoku Chemicals Corporation) are added to the resin-containing solution prepared above (A). Then, the mixture is blended using a three-roller mill to make a solution for forming resin insulation layers. The amounts of the curing agent and curing catalyst are each 3.3 grams per 100 grams of epoxy. The solution for forming resin insulation layers is applied on a polyethylene terephthalate sheet using a roll coater (made by Cermatronics Boeki, Co., Ltd.) The solution is thermally dried at 160° C. for five minutes to remove the solvent. Resin insulation-layer film containing inorganic particles is obtained. The thickness is approximately 20 μm~50 μm. The amount of inorganic particles in the cured resin insulation-layer film is 30 vol. % to 60 vol. %.

(C) Method for Manufacturing Inductor Component

The method for manufacturing an inductor component of the second embodiment is the same as the method for forming an inductor component according to the first embodiment. Using the resin insulation-layer film containing inorganic particles in the second embodiment, an inductor component is obtained in the same manner as in the first embodiment. In the second embodiment, resin insulation layers including the uppermost and lowermost resin insulation layers are each made of inorganic particles and resin such as epoxy.

(D) Method for Manufacturing Printed Wiring Board

The method for manufacturing a printed wiring board in the second embodiment is the same as the method for forming a printed wiring board according to the first embodiment.

Third Embodiment

Figure 17:
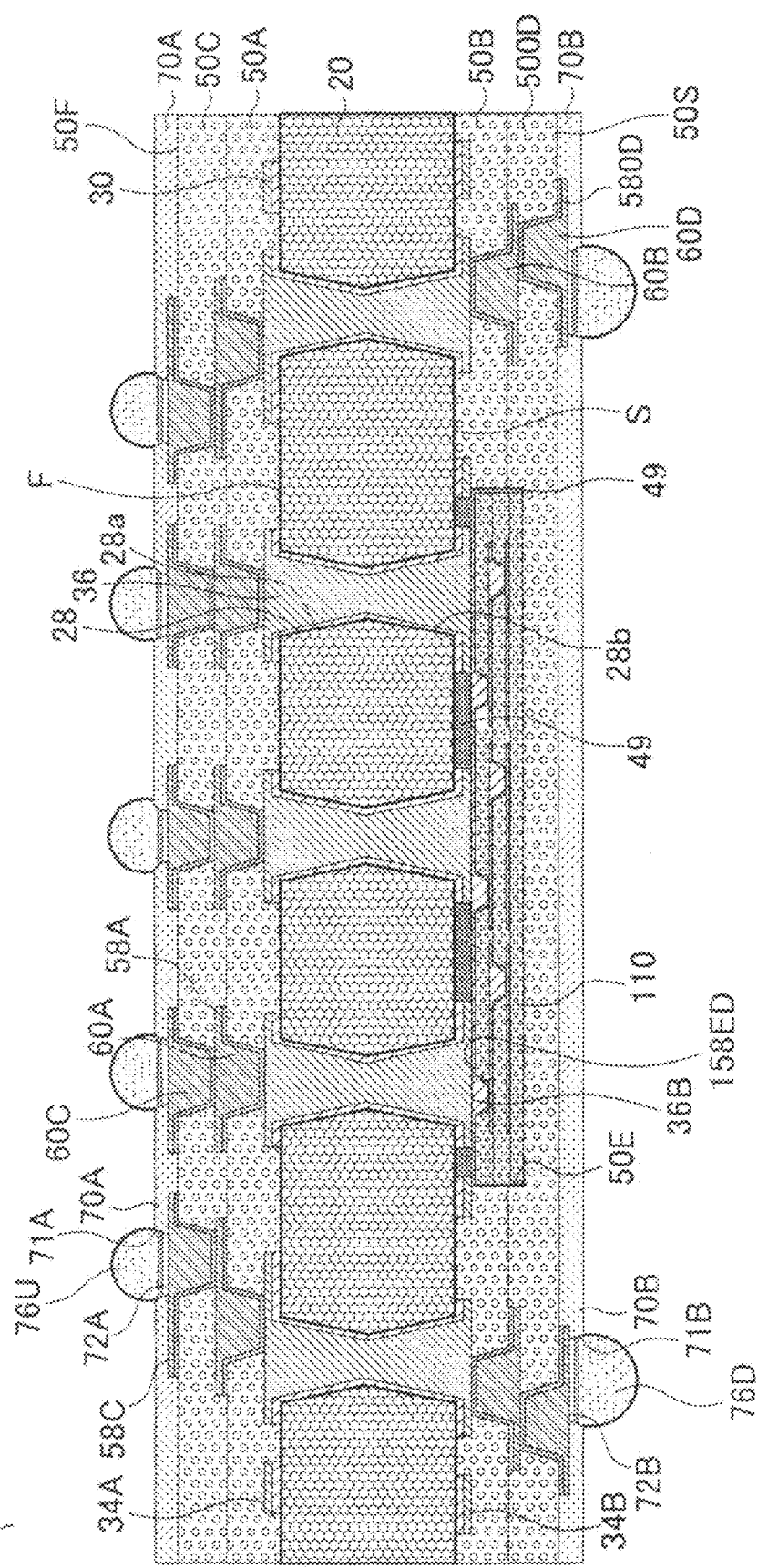
FIG. 17 is a cross-sectional view of a printed wiring board according to a third embodiment.

FIG. 17 shows a printed wiring board according to a third embodiment.

In the third embodiment, cavity (50E) is formed in insulation layer (50B) of the lower buildup layer, and inductor component 110 is accommodated in the cavity. Cover insulation layer (500D) is formed on the inductor component. No conductive circuit is formed on the cover insulation layer positioned directly on the inductor component. Conductive layer (580D) on the cover insulation layer is formed in the region excluding the portion directly on the inductor component. The cover insulation layer covers the lower buildup layer and the inductor component.

Fourth Embodiment

Figure 19:
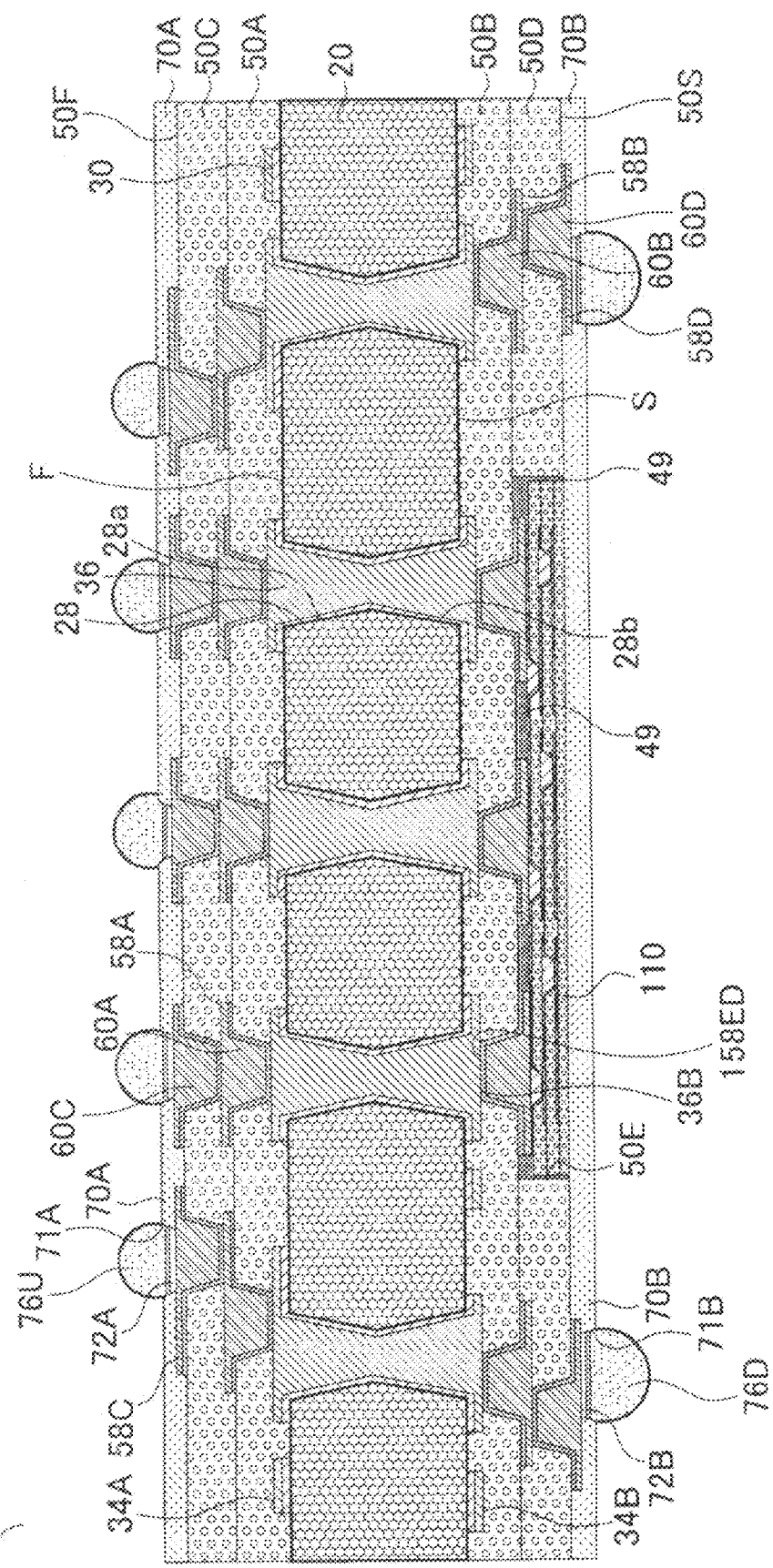
FIG. 19 is a cross-sectional view of a printed wiring board according to a fourth embodiment.

FIG. 19 shows a printed wiring board according to a fourth embodiment.

In the fourth embodiment, cavity (50E) is formed in lowermost interlayer resin insulation layer (50D) of the lower buildup layer, and an inductor component is accommodated in the cavity. The cavity is not formed in the lower interlayer resin insulation layer. An inductor component is accommodated in the cavity, which is positioned on lower interlayer resin insulation layer (50B) and is formed in the lowermost interlayer resin insulation layer. The inductor component and the core substrate are connected by via conductors (60B) in lower interlayer resin insulation layer (50B). In the fourth embodiment, the inductor component and the printed wiring board are connected through lower conductive layer (58B) or lower via conductors.

In each embodiment, coil layers of an inductor component are preferred to overlap with each other. Namely, when each coil layer is projected at the same magnification on the first surface of the core substrate, images of the coil layers overlap with each other.

The thermal expansion coefficient of a built-in inductor component in each embodiment is lower than the thermal expansion coefficient of the insulative base. In each embodiment, the number of resin insulation layers of the inductor component is greater than the number of insulation layers (interlayer resin insulation layers) of the lower buildup layer. In each embodiment, the number of coil layers of the inductor component is greater than the number of conductive layers of the lower buildup layer. An inductor component with high inductance is built into a thin printed wiring board. The area of the conductors in an inductor component is small. Since the number of coil layers of an inductor component is greater than the number of conductive layers of the buildup layer, volumes of conductors come close to each other in the upper and lower buildup layers. Warping of the printed wiring board is reduced.

A printed wiring board according to an embodiment of the present invention has the following: a core substrate having a first surface and a second surface opposite the first surface; an upper buildup layer formed on the first surface of the core substrate and having an upper insulation layer and an upper conductive layer; a lower buildup layer formed on the second surface of the core substrate and having a lower insulation layer, a lower conductive layer and a cavity to accommodate an inductor component; and an inductor component accommodated in the cavity. In such a printed wiring board, the inductor component is made up of a resin insulation layer and a coil layer on the resin insulation layer.

A method for manufacturing a printed wiring board according to another embodiment of the present invention includes the following: forming a core substrate having a first surface and a second surface opposite the first surface; on the first surface of the core substrate, forming an upper buildup layer having an insulation layer and a conductive layer; on the second surface of the core substrate, forming a lower buildup layer having an insulation layer and a conductive layer; in the lower buildup layer, forming a cavity to accommodate an inductor component; and accommodating an inductor component in the cavity.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a core substrate;
   a first buildup layer formed on a first surface of the core substrate and comprising an insulation layer and a conductive layer;
   a second buildup layer formed on a second surface of the core substrate on an opposite side with respect to the first buildup layer and comprising an insulation layer and a conductive layer; and
   an inductor device positioned in the second buildup layer and comprising a resin insulation layer and a coil layer formed on the resin insulation layer,
   wherein the second buildup layer has a cavity in which the inductor device is accommodated.

2. The printed wiring board according to claim 1, wherein the inductor device has the resin insulation layer in a plurality, the coil layer in a plurality and a plurality of via conductors formed in the plurality of resin insulation layers such that the via conductors are formed in the resin insulation layers and connecting the coil layers through the resin insulation layers.

3. The printed wiring board according to claim 2, wherein the core substrate has a through-hole conductor formed through the core substrate, the cavity of the second buildup layer is formed such that the cavity is exposing a portion of the second surface of the core substrate and an end portion of the through-hole conductor on the portion of the second surface of the core substrate, and the inductor device has an electrode connected to the end portion of the through-hole conductor.

4. The printed wiring board according to claim 3, further comprising a conductive member connecting the electrode of the inductor device and the end portion of the through-hole conductor.

5. The printed wiring board according to claim 2, wherein the resin insulation layer of the inductor device has a thickness which is less than a thickness of the insulation layer of the second buildup layer.

6. The printed wiring board according to claim 2, wherein the insulation layer in the second buildup layer is formed in a plurality, and the inductor device has the plurality of resin insulation layers in a number greater than a number of the plurality of insulation layers in the second buildup layer.

7. The printed wiring board according to claim 2, further comprising a filler resin material filling a gap formed around the inductor device in the cavity of the second buildup layer.

8. The printed wiring board according to claim 7, wherein the filler resin material includes magnetic particles.

9. The printed wiring board according to claim 7, wherein the filler resin material is filling a space formed between the second surface of the core substrate and the inductor device.

10. The printed wiring board according to claim 1, further comprising a cover insulation layer formed on the second buildup layer such that the cover insulation layer is covering the inductor device and the second buildup layer, wherein the cover insulation layer has a portion directly on the inductor device, and the portion of the cover insulation layer directly on the inductor device has no conductive circuit formed thereon.

11. The printed wiring board according to claim 1, further comprising a solder-resist layer formed on the second buildup layer such that the solder-resist layer is covering the inductor device.

12. The printed wiring board according to claim 1, further comprising a chip capacitor mounted on the second buildup layer.

13. A method for manufacturing a printed wiring board, comprising:
    forming on a first surface of a core substrate a first buildup layer comprising an insulation layer and a conductive layer;
    forming on a second surface of the core substrate on an opposite side with respect to the first buildup layer a second buildup layer comprising an insulation layer and a conductive layer;
    forming in the second buildup layer a cavity for accommodating an inductor device comprising a resin insulation layer and a coil layer formed on the resin insulation layer; and accommodating the inductor device in the cavity of the second buildup layer such that the inductor device is positioned in the cavity of the second buildup layer.

14. The method for manufacturing a printed wiring board according to claim 13, further comprising:
filling a filler resin material into a gap formed around the inductor device in the cavity of the second buildup layer.

15. The method for manufacturing a printed wiring board according to claim 14, wherein the filler resin material includes magnetic particles.

16. The method for manufacturing a printed wiring board according to claim 13, further comprising:
forming a cover insulation layer on the second buildup layer such that the cover insulation layer is covering the inductor device and the second buildup layer; and
forming a conductive circuit on the cover insulation layer such that the conductive circuit is not formed on a portion of the cover insulation layer directly on the inductor device.

17. The method for manufacturing a printed wiring board according to claim 13, further comprising:
forming a solder-resist layer on the second buildup layer such that solder-resist layer is covering the inductor device.

18. The method for manufacturing a printed wiring board according to claim 13, wherein the forming of the cavity comprises forming a cavity in the second buildup layer such that the cavity exposes a portion of the second surface of the core substrate.

19. The method for manufacturing a printed wiring board according to claim 13, wherein the core substrate has a through-hole conductor formed through the core substrate, the forming of the cavity comprises forming a cavity in the second buildup layer such that the cavity exposes an end portion of the through-hole conductor and a portion of the second surface of the core substrate, and the accommodating of the inductor device includes connecting the end portion of the through-hole conductor and an electrode of the inductor device.

20. The method for manufacturing a printed wiring board according to claim 13, further comprising:
mounting a chip capacitor on the second buildup layer.

* * * * *